United States Patent
Sakai

(10) Patent No.: US 8,794,610 B2
(45) Date of Patent: Aug. 5, 2014

(54) TWO-DIMENSION PRECISION TRANSFER EQUIPMENT, THREE-DIMENSION PRECISION TRANSFER EQUIPMENT, AND COORDINATE MEASURING MACHINE

(75) Inventor: Hisayoshi Sakai, Kawasaki (JP)

(73) Assignee: Mitutoyo Corporation, Kanagawa (JP)

(*) Notice: Subject to any disclaimer, the term of this patent is extended or adjusted under 35 U.S.C. 154(b) by 23 days.

(21) Appl. No.: 13/613,706

(22) Filed: Sep. 13, 2012

(65) Prior Publication Data

US 2013/0069294 A1 Mar. 21, 2013

(30) Foreign Application Priority Data

Sep. 20, 2011 (JP) ................................. 2011-205382
Jan. 27, 2012 (JP) ................................. 2012-015032

(51) Int. Cl.
*B23Q 1/25* (2006.01)
*G05B 11/32* (2006.01)
*G05B 1/06* (2006.01)
*G03B 27/58* (2006.01)

(52) U.S. Cl.
USPC ................ 269/55; 318/625; 318/640; 355/72

(58) Field of Classification Search
USPC .......... 269/55; 318/625, 687, 640; 355/72, 53
See application file for complete search history.

(56) References Cited

U.S. PATENT DOCUMENTS

| | | | | |
|---|---|---|---|---|
| 4,742,286 A | * | 5/1988 | Phillips | 318/640 |
| 5,760,564 A | * | 6/1998 | Novak | 318/687 |
| 5,839,324 A | | 11/1998 | Hara | |
| 5,886,494 A | * | 3/1999 | Prentice et al. | 318/625 |
| 5,955,876 A | * | 9/1999 | Yamauchi et al. | 324/750.19 |
| 6,130,490 A | * | 10/2000 | Lee | 310/12.06 |
| 6,323,494 B1 | | 11/2001 | Lee | |
| 6,674,085 B2 | * | 1/2004 | Miura et al. | 250/442.11 |
| 6,716,220 B2 | * | 4/2004 | Saracione | 606/130 |
| 6,842,226 B2 | * | 1/2005 | Watson et al. | 355/72 |
| 6,935,038 B2 | * | 8/2005 | Fan et al. | 33/542 |
| 8,553,203 B2 | * | 10/2013 | Shibazaki | 355/72 |
| 8,582,080 B2 | * | 11/2013 | Binnard et al. | 355/53 |

FOREIGN PATENT DOCUMENTS

| | | |
|---|---|---|
| DE | 102008060209 | 5/2010 |
| JP | 2000-55617 A | 2/2000 |
| JP | 2002-258950 A | 9/2002 |
| JP | 2006-114557 A | 4/2006 |
| JP | 2006-205292 A | 8/2006 |

OTHER PUBLICATIONS

Search report from E.P.O., mail date is Jan. 3, 2013.
U.S. Appl. No. 13/612,972 to Hisayoshi Sakai, which was filed Sep. 13, 2012.
U.S. Appl. No. 13/613,157 to Hisayoshi Sakai, which was filed Sep. 13, 2012.

* cited by examiner

*Primary Examiner* — Lee D Wilson
*Assistant Examiner* — Alvin Grant
(74) *Attorney, Agent, or Firm* — Greenblum & Bernstein, P.L.C.

(57) ABSTRACT

A coordinate measuring machine includes a three-dimension precision transfer equipment and a measuring equipment that measures an object. The three-dimension precision transfer equipment includes a movable body, first to third driving bodies, first to third drive mechanisms that drive to move the first to third driving bodies forward and backward in a first direction, a second direction and a vertical direction that are mutually orthogonal, and first to third laser interferometers that detect a displacement of the movable body. The first to third driving bodies include first to third joints that forms a static-pressure clearance between the first to third driving bodies and the movable body. Laser paths of the first to third laser interferometers extend in a manner to respectively penetrate the first to third driving bodies and the first to third joints.

12 Claims, 13 Drawing Sheets

TWO-DIMENSION PRECISION TRANSFER EQUIPMENT, THREE-DIMENSION PRECISION TRANSFER EQUIPMENT, AND COORDINATE MEASURING MACHINE

The entire disclosure of Japanese Patent Applications No. 2011-205382 filed Sep. 20, 2011 and No. 2012-015032 filed Jan. 27, 2012 is expressly incorporated by reference herein.

BACKGROUND OF THE INVENTION

1. Field of the Invention

The present invention relates to two-dimension precision transfer equipment, three-dimension precision transfer equipment and coordinate measuring machine that transfer a work table or a column of measuring equipment and a machine tool with a high precision for positioning.

2. Description of Related Art

Precision transfer equipment requiring a high motion accuracy (e.g., a precision positioning system, precision measuring equipment and a machine tool) has been demanded to move an object to be moved (e.g., a work table and a main shaft column) with a high geometric accuracy of motion and, in addition, to accurately detect and control a position of the object in a linear moving direction.

A work table and a spindle column movable in two dimensions (i.e., X and Y directions) in a horizontal plane are frequently used.

For instance, in order to move a table in two directions of an X-axis and a Y-axis, two ball-screw mechanisms are provided to a base in a direction orthogonal to each other and the table movable in two directions (i.e., X and Y directions) is provided on an upper side of the two ball screw mechanisms, where the table is moved in each axial direction by each of the ball screw mechanisms (see Patent Literature 1: JP-A-2002-258950).

In addition to the ball screw mechanism, transmission mechanisms such as friction drive, belt drive, and rack-and-pinion are appropriately employed as a mechanism for driving in each axial direction.

For detecting and controlling a position of the object, it is desirable that the mechanism satisfies the Abbe's principle. In other words, a detecting axis for identifying the position of the object is desirably disposed to pass through a point of action for a measurement or processing performed by moving the object.

In the above Patent Literature 1, since the ball screw mechanisms are provided on the circumference of the table, an offset of a thrusting axis against a moving axis passing through the center of the object is large. In contrast, by layering a Y-axis drive mechanism on an X-axis drive mechanism to form a double-layer structure and providing the X-axis drive mechanism and the Y-axis drive mechanism immediately beneath the table, an offset between the moving axis and the thrusting axis is suppressible since the moving axis and the thrusting axis are drawn closer to each other (see Patent Literature 2: JPA-2006-114557).

Moreover, in some equipment, a driving force acts on a side of the table in order to reduce a vertical offset as described in Patent Literature 2 (see Patent Literature 3: JP-A-2006-205292).

In the equipment described in Patent Literature 3, a drive roller moves a rod forward and backward, the rod being connected to a side of the table to drive the table.

In Patent Literature 3, the rod and the table is connected by a fluid static-pressure joint. Especially, a supplying-discharging static-pressure bearing or a vacuum-balanced static-pressure air bearing can secure a strong rigidity in a compression direction and a tensile direction. With a drive mechanism using a static-pressure bearing having such a high rigidity, a geometric accuracy of motion of a highly precise linear moving table is improved.

The static-pressure joint disclosed in Patent Literature 3 further includes a thrust plate that is supported near the rod by a gimbal mechanism absorbing a motion error in a yawing direction and is supported near the table by a similar gimbal mechanism absorbing a motion error in a pitching direction. Through the joint, forces other than the force in the moving direction of the table are not transmitted.

With the use of such a drive mechanism of Patent Literature 3, the vertical offset as described above in Patent Literature 2 can be eliminated. In addition, since the X-axis drive mechanism and the Y-axis drive mechanism are provided on the respective sides of the table, the double-layer structure is not required, so that the total height of the equipment is reduced.

In each of the above-described transfer equipment, it is necessary not only to accurately drive the table but also to position the table with a high precision. For this reason, transfer equipment provided with a laser interferometer as a position detecting mechanism that detects a current position of the table with a high precision has been used (see Patent Literature 4: JP-A-2000-55617).

In the equipment of Patent Literature 4, a slider driving mechanism using a feed screw shaft is provided under the table. The feed screw shaft allows a horizontal movement of the table provided thereon. The laser interferometer is provided to a side of the table, whereby a current position of the table is detectable with a high precision.

In this arrangement, a laser path extending from a light source of the laser interferometer to an end of the table is surrounded by a stretchable tube with a bellows, in which an inner pressure of the tube is reduced to eliminate an influence from air turbulence in the laser path, thereby achieving further high precision.

With such a laser interferometer, it is possible to accurately detect and control a position of the movable body in a feed direction, in addition to a high geometric accuracy of motion of the drive mechanism and the movable body.

As described above, when the drive mechanism of Patent Literature 3 is used in the X-axis and the Y-axis, the moving axis in a predetermined moving direction which passes through the centroid of the table can be aligned with the thrusting axis of the driving force obtained by the drive mechanism and the total height of the equipment is reducible while satisfying the Abbe's principle.

In such highly precise transfer equipment, it is necessary to combine the laser interferometer of the Patent Literature 4 and the like with the transfer mechanism of each axis for a highly precise position-detection.

When a highly precise position-detection is conducted with use of the laser interferometer and the like, it is desirable that the detecting axis also satisfies the Abbe's principle and it is desirable that the laser path (i.e., the detecting axis) is aligned with the moving axis and the thrusting axis.

However, it is mechanically difficult to coaxially arrange the laser path of the laser interferometer of Patent Literature 4 and the driving axis by the rod and the static-pressure air joint of Patent Literature 3.

Particularly, in Patent Literature 4, in order to eliminate influences of a medium in the laser path, a bellows is disposed at a reduced inner pressure to surround the laser path. An end of the bellows needs to be hermetically connected to the table.

Such a position detecting mechanism cannot be directly applied to the table moving in two directions of the X-axis and the Y-axis.

For instance, when the table is moved in the Y-axis direction, a connection portion of the bellows surrounding the laser path for position-detecting in the X-axis direction is displaced toward the side of the table, so that the laser path is bent or a mechanical connection of the bellows may become unmaintainable.

SUMMARY OF THE INVENTION

An object of the invention is to provide two-dimension precision transfer equipment, three-dimension precision transfer equipment and coordinate measuring machine that allow a highly precise movement and a highly precise positioning based on a highly precise position-detection.

According an aspect of the invention, a two-dimension precision transfer equipment includes: a base; a movable body that is supported by the base and is movable in mutually orthogonal first and second directions; a first driving body and a second driving body, both of which are connected to the movable body; a first drive mechanism that drives to move the first driving body forward and backward in the first direction; a second drive mechanism that drives to move the second driving body forward and backward in the second direction; a first displacement detector that detects a displacement in the first direction of the movable body relative to the base; and a second displacement detector that detects a displacement in the second direction of the movable body relative to the base, in which the movable body has a first connection surface extending in the second direction and a second connection surface extending in the first direction, the first driving body has a first joint forming a static-pressure clearance between the first driving body and the first connection surface, the second driving body has a second joint forming a static-pressure clearance between the second driving body and the second connection surface, the first displacement detector is a first laser interferometer having a first laser path that penetrates the first driving body and extends in the first direction, and the second displacement detector is a second laser interferometer having a second laser path that penetrates the second driving body and extends in the second direction.

In the above aspect of the invention, a drive mechanism including a power source (e.g., a motor) and a transmission mechanism that transmits the power to the first and second driving bodies is usable as the first and second drive mechanisms. As such a transmission mechanism, a friction-rolling type drive roller having a high operational continuity is desirably used. However, other transmission mechanisms are also usable.

Alternatively, the first and second drive mechanisms each may include a linear motor.

With this arrangement, when the first drive mechanism drives the first driving body, the movable body is moved in the first direction via the first driving body and the first joint. Likewise, when the second drive mechanism drives the second driving body, the movable body is moved in the second direction via the second driving body and the second joint.

By using a static-pressure joint forming a static-pressure clearance between the first joint and the first connection surface and between the second joint and the second connection surface, the driving force in the first direction is transmitted and a displacement in the second direction orthogonal to the first direction is allowable between the first joint and the first connection surface while the driving force in the second direction is transmitted and a displacement in the first direction orthogonal to the second direction is allowable between the second joint and the second connection surface. Further, since transmission of the driving force in non-contact is possible through the static-pressure clearance, influences of vibration from the driving source is avoidable.

A movement of the movable body in the first direction is detected by the first laser interferometer (i.e., the first displacement detector). A movement of the movable body in the second direction is detected by the second laser interferometer (i.e., the second displacement detector).

Since the laser interferometer having the first laser path penetrating the first driving body is used as the first displacement detector and the laser interferometer having the second laser path penetrating the second driving body is used as the second displacement detector, the following features and advantages are enjoyable.

Specifically, the first laser path of the first laser interferometer and the second laser path of the second laser interferometer each are provided as a closed space penetrating the inside of the respective first and second driving bodies. Accordingly, a precise position-detection can be enhanced by reducing the inner pressure.

Moreover, since the first and second laser paths do not require a conventional bellows and the like that need to be connected to the movable body, each displacement of the first and second laser paths orthogonal to each other is not disturbed, and even when the first and/or second laser path is displaced in the directions orthogonal to each other, the laser path is reliably maintainable.

The first and second displacement detectors exhibit a high precision with the use of laser interference. In addition, since the first and second displacement detectors are provided with the laser paths passing through the first and second driving bodies, the first and second displacement detectors can also align the detecting axes with the moving axes and the thrusting axes of the first and second driving bodies, thereby avoiding an offset error. Accordingly, the positioning accuracy for the movable body can be enhanced.

In the above aspect of the invention, it is preferable that the first joint and the second joint each are a supplying-discharging static-pressure joint comprising: the first connection surface or the second connection surface of the movable body; an opposed surface that is connected to the first driving body or the second driving body and is opposed to the first connection surface or the second connection surface; a fluid supply channel that guides pressurized fluid into the static-pressure clearance formed between the first connection surface or the second connection surface and the opposed surface; and a fluid discharge channel that is connected with a negative pressure source and discharges the fluid from the static-pressure clearance.

In the above aspect of the invention, as the fluid used in the supplying discharging static-pressure joint, not only air and other gases but also various oils and other liquids are applicable. In the application of air, air is easily available and causes no problem in case air is leaked.

With this arrangement, since the first and second joints are provided by a supplying-discharging static-pressure joint with use of the first and second connection surfaces (i.e., the sides of the movable body), the number of components is reducible and the supplying-discharging static-pressure clearance can be kept at a predetermined subtle thickness without preload in other ways.

In the above aspect of the invention, it is preferable that the first laser path penetrates the first driving body and the first joint to extend in the first direction and is provided with the first connection surface as a reflection surface, and the second laser path penetrates the second driving body and the second joint to extend in the second direction and is provided with the second connection surface as a reflection surface.

With this arrangement, each of the first and second connection surfaces used for a part of the static-pressure joint is further usable as a mirror since each of the first and second connection surfaces is a smooth surface. Accordingly, it is unnecessary to separately provide a mirror in the first and second laser paths, so that the first and second laser paths can be simplified in structure. In addition, since the reflection surface is a portion of the movable body, a direct length-measurement by laser interference becomes possible with a higher precision.

Further, since the first laser path allows light to pass through the first joint and be reflected on the first connection surface, even though the movable body is displaced in the second direction, the first laser path is maintained as a laser path for the first laser interferometer as long as the first joint is kept connected to the first connection surface. The same applies to the second laser path.

Accordingly, in the above aspect of the invention, with the arrangement in which reflection in the first and second laser paths is conducted in the first and second joints (i.e., the static-pressure joints), in addition to a high precision as described above, the laser paths can be reliably maintained even though the movable body is displaced in the directions orthogonal to each other.

In the above aspect of the invention, it is preferable that each of the opposed surfaces of the first joint and the second joint is provided with a transparent plate that hermetically seals the first laser path or the second laser path penetrating the first driving body or the second driving body from the static-pressure clearance and is inclined against an optical axis of the first laser path or the second laser path.

With this arrangement, the pressure in the laser path within the driving body can be set to the reduced pressure irrespective of the air pressure in the static-pressure clearance. Accordingly, even when the pressure of the static-pressure clearance is high relative to the high vacuum required for the laser path, in other words, when the fluid is provided by gas having a high pressure, or when the fluid is provided by liquid, the fluid of the static-pressure clearance can be avoided from flowing into the laser path.

Herein, since the transparent plate is inclined against the optical axis, any unnecessary reflection light is not returned to the laser interferometer in the measurement using the laser interferometer.

In the aspect of the invention, it is not essential to provide the transparent plate for separating the static-pressure clearance from the laser path. For instance, when the pressure in the static-pressure clearance is sufficiently reduced, or when a vacuum degree of the laser path is low, the static-pressure clearance may be communicated with the laser path within the driving body.

According to another aspect of the invention, a three-dimension precision transfer equipment includes: the two-dimension precision transfer equipment according to the above aspect of the invention; a third driving body that is supported by the base and on which the movable body is mounted; a third drive mechanism that drives to move the third driving body forward and backward in a vertical direction; and a third displacement detector that detects a displacement in the vertical direction of the movable body relative to the base, in which the first direction and the second direction are orthogonal to the vertical direction, the movable body has a third connection surface orthogonal to the vertical direction, the third driving body has a third joint forming a static-pressure clearance between the third joint and the third connection surface, and the third displacement detector is a third laser interferometer having a third laser path that penetrates the third driving body and extends in the vertical direction.

In the above aspect of the invention, similar to the first and second drive mechanisms, a drive mechanism including a power source (e.g., a motor) and a transmission mechanism (e.g., a friction rolling drive roller) that transmits the power to the third drive mechanism, and a drive mechanism using a linear motor are usable as the third drive mechanism.

With this arrangement, since the three-dimension precision transfer equipment includes the above two-dimension precision transfer equipment, the same features and advantages as those of the above two-dimension precision transfer equipment are enjoyable.

The three-dimension precision transfer equipment includes the third drive mechanism and the third driving body in addition to the two-dimension precision transfer equipment. Moreover, the third joint provided in the third driving body provides a static-pressure joint for forming the static-pressure clearance between the third joint and the third connection surface in the same manner as the first and second joints.

In other words, between the third joint and the third connection surface, a driving force in the vertical direction by the third drive mechanism is transmitted and displacements in the first and second directions orthogonal to the vertical direction by the first and second drive mechanisms are allowable.

Accordingly, when the first, second and third drive mechanisms drive the respective driving bodies, the movable body can be moved in the first direction, the second direction and the vertical direction.

When the static-pressure joints are respectively used for connecting the first, second and third driving bodies to the movable body, a driving force can be transmitted in non-contact through the respective static-pressure clearances, so that the movable body can be moved in three dimensions while avoiding influences of vibration from the driving source.

Similar to the first and second displacement detectors, the third displacement detector is provided by the third laser interferometer having the third laser path penetrating the third driving body.

Accordingly, the same features and advantages as those of the above two-dimension precision transfer equipment using the laser interferometer (i.e., the first and second displacement detectors) having the laser path penetrating the driving body are enjoyable.

In the above aspect of the invention, it is preferable that the third joint is a supplying-discharging static-pressure joint including: the third connection surface of the movable body; an opposed surface that is connected to the third driving body and is opposed to the third connection surface; a fluid supply channel that supplies fluid into a static-pressure clearance formed between the third connection surface and the opposed surface; and a fluid discharge channel that is connected with a negative pressure source and discharges the fluid from the static-pressure clearance.

In the above aspect of the invention, as the fluid used in the supplying-discharging static-pressure joint, not only air and other gases but also various oils and other liquids are applicable in the same manner as in the two-dimension precision transfer equipment.

With this arrangement, the same features and advantages as those of the above two-dimension precision transfer equipment using the supplying-discharging static-pressure joint (i.e., the first and second joints) are enjoyable.

In the above aspect of the invention, it is preferable that the third laser path penetrates the third driving body and the third joint to extend in the vertical direction and is provided with the third connection surface as a reflection surface.

With this arrangement, the same features and advantages as those of the above two-dimension precision transfer equipment including the first and second laser paths using the first and second connection surfaces as a reflection surface are enjoyable.

In the above aspect of the invention, it is preferable that the opposed surface of the third joint is provided with a transparent plate that hermetically seals the third laser path penetrating the third driving body from the static-pressure clearance and is inclined against an optical axis of the third laser path.

With this arrangement, the same features and advantages as those of the above two-dimension precision transfer equipment including the transparent plate provided on the opposed surfaces of the first and second joints are enjoyable.

In the above aspect of the invention, it is preferable that the three-dimension precision transfer equipment further includes a piston cylinder mechanism including: a piston portion provided in the third driving body; and a cylinder portion that is fixed to the base and supports the piston portion to be movable in the vertical direction, in which the piston cylinder mechanism includes a pressurized chamber to which pressurized fluid is supplied from an outside and receives a load of the third driving body.

With this arrangement, since the piston cylinder mechanism is provided between the third driving body and the base, when the third driving body is driven by the third drive mechanism, the piston portion (i.e., a moving component of the third driving body) is movable in the vertical direction while being supported by the cylinder portion.

Moreover, since the pressurized chamber is provided inside the piston cylinder mechanism, the weight of the third driving body is receivable by the fluid inside the pressurized chamber.

In other words, the driving force for moving the third driving body forward and backward is reducible, so that a load of the driving source is reducible and heat generation thereof is also suppressible.

In the above aspect of the invention, it is preferable that the piston cylinder mechanism includes a pressure receiving surface that faces the pressurized chamber and receives a pushup force against the piston portion from the fluid in the pressurized chamber, and an inner pressure of the pressurized chamber is set at a pressure calculated by dividing a total weight of the movable body, the third driving body, the piston portion and the third joint by an area of the pressure receiving surface.

With this arrangement, since the inner pressure of the pressurized chamber is set at the above-described pressure, the push-up force of the fluid in the pressurized chamber against the piston portion can be balanced with a push-down force of the piston portion and the like against the piston portion, the push-down force corresponding to the weight of the piston portion and the like.

Consequently, the driving force for moving the third driving body forward and backward is significantly reducible.

According to still another aspect of the invention, a coordinate measuring machine includes: the three-dimension precision transfer equipment, and a measuring equipment that is supported by the base and measures an object to be mounted on the movable body.

In the above aspect of the invention, the measuring equipment may be configured to have a contact-type probe provided with a stylus tip that abuts on the object or have an optical non-contact probe that does not abut on the object.

With this arrangement, since the coordinate measuring machine includes the above three-dimension precision transfer equipment, the same features and advantages as those of the above three-dimension precision transfer equipment are enjoyable.

For instance, when the measuring equipment having a contact-type probe is employed, the three-dimension precision transfer equipment moves the movable body (the object) in three dimensions while a contact-type probe is fixed at a predetermined position relative to the base. With reference to displacements (coordinate values) of the movable body in the first direction, the second direction and the vertical direction which are detected by the first to third displacement detectors when the stylus tip is in contact with the object, dimensions and a shape of the object can be measured.

In the above aspect of the invention, it is preferable that the measuring equipment includes a probe having a spherical stylus tip to be brought into contact with the object, imaginary lines respectively provided by imaginarily extending the first laser path, the second laser path and the third laser path intersect at a single intersection, and the measuring equipment is supported by the base such that a central position of the stylus tip coincides with the intersection of the imaginary lines.

With this arrangement, the displacements of the movable body (the object) in the first direction, the second direction and the vertical direction can be measured in a manner to satisfy the Abbe's principle.

Consequently, dimensions and a shape of the object can be measured with a high precision.

DESCRIPTION OF EMBODIMENT(S)

Exemplary embodiment(s) of the invention will be described below with reference to the attached drawings.

First Exemplary Embodiment

FIGS. 1 to 4 show a first exemplary embodiment of the invention.

Figure 1:
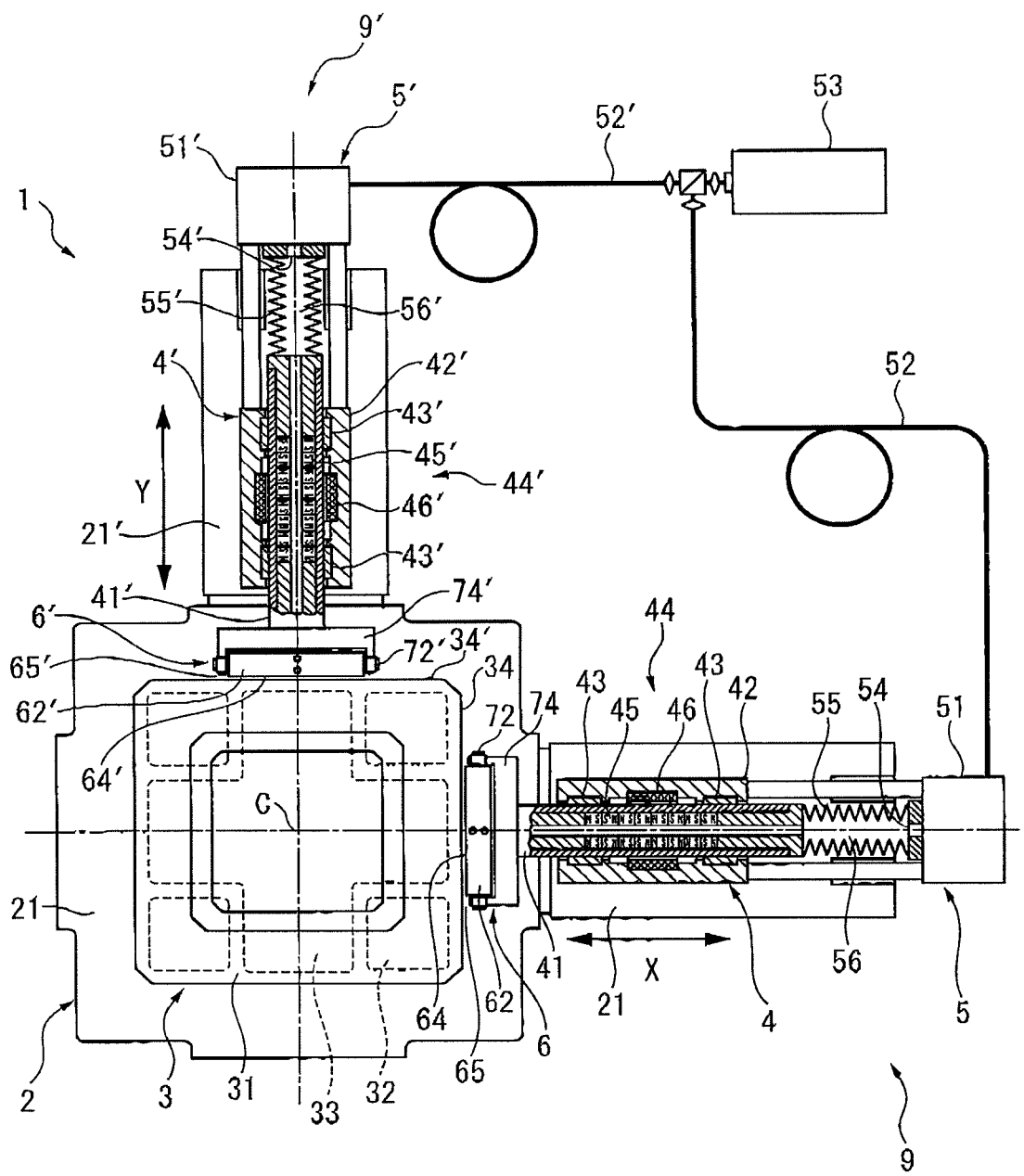
FIG. 1 is a plan view showing an overall structure according to a first exemplary embodiment of the invention.

In FIG. 1, two-dimension precision transfer equipment 1 according to the first exemplary embodiment includes: a base 2; and a table mechanism 3, a first drive mechanism 4, a second drive mechanism 4', a first laser interferometer 5 (a first displacement detector) and a second laser interferometer 5' (a second displacement detector) provided on the base 2.

Figure 2:
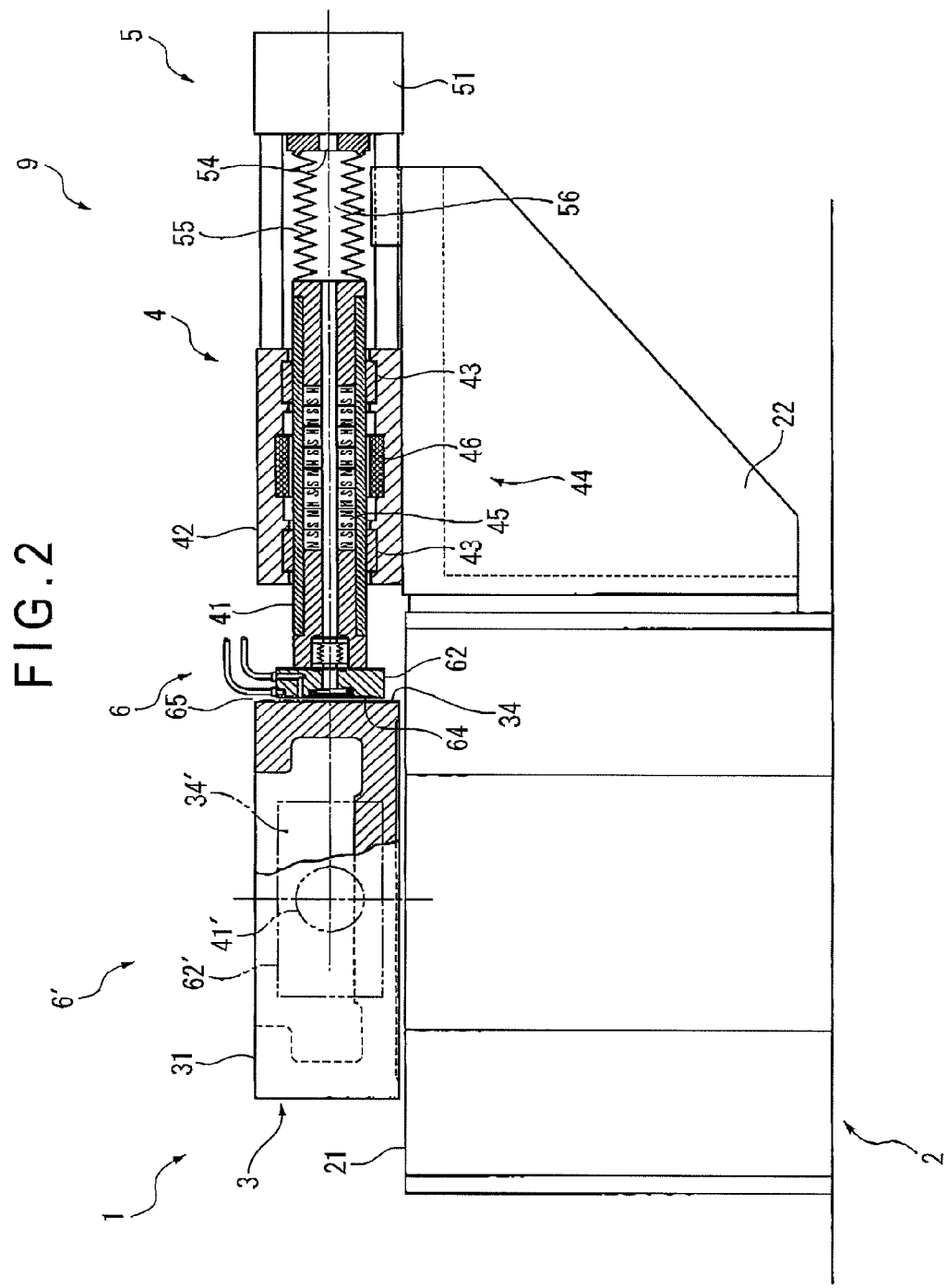
FIG. 2 is a vertical section showing the overall structure according to the first exemplary embodiment.

As shown in FIG. 2 the base 2 is a block member fixed on a stable foundation. An upper surface 21 of the base 2 is formed horizontally.

A support base 22 that laterally projects is provided on a side of the base 2. The first and second drive mechanisms 4 and 4' and the first and second laser interferometers 5 and 5' are supported by the support base 22 so as to be positioned at the same height as the table 31 of the table mechanism 3.

The upper surface 21 of the base 2 is processed to have a sufficiently high flatness and smoothness so as to form a static-pressure air bearing in the table mechanism 3.

The table mechanism 3 includes a table 31 as a movable body,

The table 31 is a substantially square member in a plan view with a predetermined thickness, in which a static-pressure air bearing is provided at each of four corners of the bottom.

Figure 3:
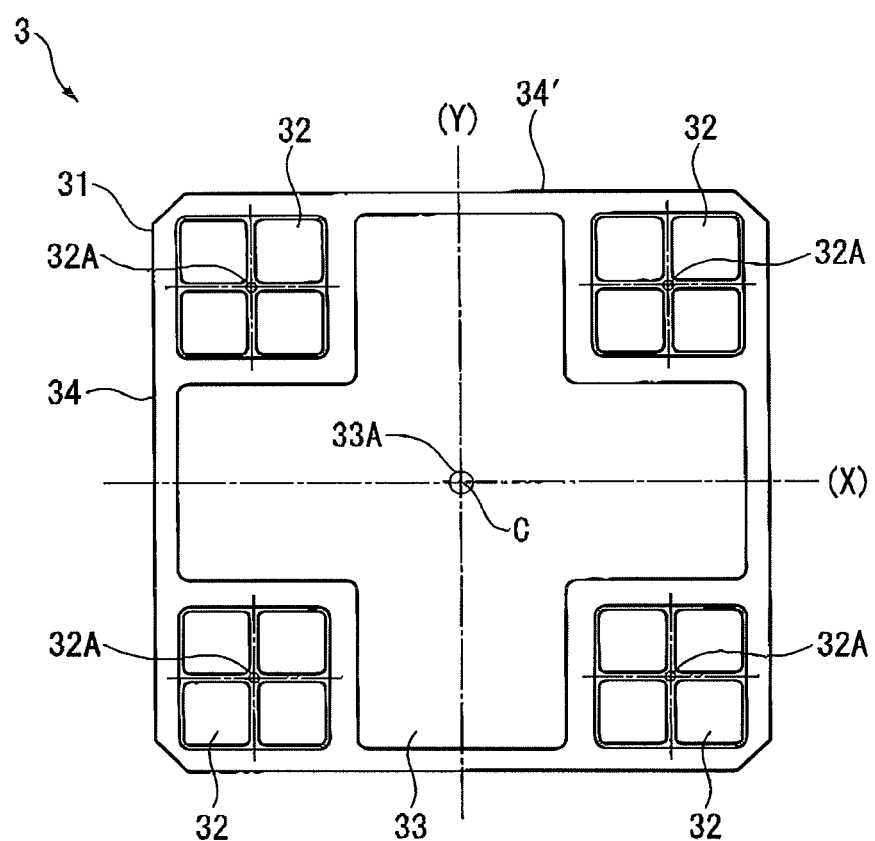
FIG. 3 is a bottom view showing a table according to the first exemplary embodiment.

As shown in FIG. 3, a static-pressure air bearing 32 is provided by four static-pressure air bearings, each of which is formed as a lattice-shaped groove. When pressurized air is supplied into the grooves through a fluid restrictor 32A from an external fluid supply source (not shown), a static-pressure clearance 35 is formed between the upper surface 21 of the base 2 and the static-pressure air bearing 32, so that the table 31 is supported while being levitated above the base 2.

In the first exemplary embodiment, although the static-pressure air bearing 32 can be preloaded with a load of the table 31, a negative pressure portion 33 that is shaped in a cross is further formed in the middle of the bottom of the table 31 for reinforcement of the preload. The negative pressure portion 33 is provided with a discharge hole 33A connected to an external exhaust device (not shown) and the like that can make negative pressure. When an inner pressure of the negative pressure portion 33 is reduced by an external exhaust device, the negative pressure portion 33 can suck the table 31 toward the upper surface 21 of the base 2. By using this sucking force as preload against the static-pressure air bearing 32, an air film of the static-pressure clearance 35 in the static-pressure air bearing 32 can obtain a higher rigidity.

With use of the static-pressure air bearing 32, the table 31 is supported in non-contact with the upper surface of the base 2 and is movable as needed in an X-axis direction (a first direction: a horizontal direction in FIG. 1) and in a Y-axis direction (a second direction: a vertical direction in FIG. 1).

In FIGS. 1 and 2, the first drive mechanism 4 and the first laser interferometer 5 provide a first precision feeding device 9 that moves the table 31 of the table mechanism 3 in the X-axis direction (the first direction) for positioning. The first precision feeding device 9 includes a first rod 41 and a first joint 6 (a first driving body).

The second drive mechanism 4' and the second laser interferometer 5' provide a second precision feeding device 9' that moves the table 31 of the table mechanism 3 in the Y-axis direction (the second direction) for positioning. The second precision feeding device 9' includes a second rod 41' and a second joint 6' (a second driving body).

The first precision feeding device 9 and the components thereof are the same as the second precision feeding device 9' and the components thereof except for being disposed at different positions and in different directions. Accordingly, in the following description, the second precision feeding device 9' and the components thereof are denoted by adding a prime (') to the reference numerals representing the first precision feeding device 9 and the components thereof and overlapping descriptions may be omitted as needed.

The first drive mechanism 4 drives the first rod 41 (the first driving body) and includes a casing 42 fixed on the base 2 and a linear motor 44 as a driving source.

The first rod 41 is a hollow elongated tubular member that extends in the X-axis direction (the first direction). Both ends of the first rod 41 (a base on the right and a tip end on the left in FIG. 1) project beyond the casing 42. The tip end of the first rod 41 is connected to a side 34 of the table 31 via the first joint 6.

The casing 42 includes a rod guide 43 through which the first rod 41 is introduced and which smoothly and slidably receives a circumference of the first rod 41, the rod guide 43 being provided at two positions. By being supported by the rod guides 43, the first rod 41 is kept supported in the X-axis direction and is freely movable in a longitudinal direction of the first rod 41. The rod guides 43 provide a guide mechanism.

The linear motor 44 includes: a magnet 45 (a movable member) that is provided in the first rod 41; and an induction coil 46 (a stator) that is provided to the casing 42.

The magnet 45 is provided as a tube formed by layering a plurality of ring magnets or magnet members that are provided by connecting arc-shaped magnets in a form of a ring while center holes of the ring magnets and the magnet members are in alignment. The magnet 45 is housed inside a surface material of the first rod 41

The induction coil 46 is formed in a ring surrounding the circumference of the first rod 41 and is supported in the middle of the casing 42. The induction coil 46 is supplied with a driving electric current according to a moving direction and a moving speed of the first rod 41 from an external controller (not shown), so that the magnet 45 and the induction coil 46 serve as the linear motor 44.

The induction coil 46, the magnet 45, the rod guides 43 and the first rod 41 are coaxially disposed, so that a thrusting axis of the linear motor 44 and a moving axis of the first rod 41 are in alignment and are also aligned with an axis in the X-axis direction passing through a centroid C of the table 31.

The laser interferometer 5 includes an interferometer body 51 that houses basic elements such as a light-receiving element and a splitter. An external laser source 53 is connected to the interferometer body 51 via an optical fiber 52.

A laser beam window 54 of the interferometer body 51 is connected to the base of the first rod 41 via a metallic bellows 55. Although a distance between the first rod 41 and the interferometer body 51 fluctuates since the first rod 41 moves forward and backward in the longitudinal direction as described above, the connection between rod 41 and the interferometer body 51 is maintained by expansion and contraction of the bellows 55.

An inside of the bellows 55 and a hollow portion of the first rod 41 intercommunicate with each other. Such a continuous space provides a first laser path 56.

In order to enhance measurement accuracy, an inner pressure of the first laser path 56 is reduced to a high vacuum state. While being expansible and contractible in the longitudinal direction as the first rod 41 moves, the bellows 55 securely has a predetermined rigidity in a radial direction by being made of metal. Accordingly, even if a difference between an internal air pressure and an external air pressure of the bellows 55 is large, the bellows 55 does not collapse.

The second drive mechanism 4' drives the second rod 41' (the second driving body).

The second rod 41' is disposed in the Y-axis direction (the second direction) and driven by the second drive mechanism 4' to move forward and backward in the Y-axis direction. A position of the second rod 41' in the Y-axis direction is detected by the second laser interferometer 5'.

A casing 42', rod guides 43', a linear motor 44', a magnet 45' and an induction coil 46' (i.e., the components of the second drive mechanism 4') are the same as those of the first drive mechanism 4.

A second laser interferometer 5', an optical fiber 52', a laser beam window 54', a bellows 55', and a second laser path 56' (i.e., the components of the second laser interferometer 5') are the same as those of the first laser interferometer 5. The laser source 53 (a single laser source) is shared by the first and second laser interferometers 5 and 5' with the optical fibers 52 and 52' branched halfway.

As described above, the first rod 41 is connected to the side 34 of the table 31 via the first joint 6.

In FIG. 1, the side 34 of the table 31 is orthogonal to the upper surface 21 of the base 2 and forms a right angle with a side 34'. The side 34 to which the first joint 6 is connected is a flat surface that is orthogonal to the X-axis direction of the table 31 and extends in the Y-axis direction.

The side 34' adjacent to the side 34 of the table 31 is connected with the second joint 6'. The side 34' is a flat surface that is orthogonal to the Y-axis direction of the table 31 and extends in the X-axis direction.

The sides 34 and 34' of the table 31 are respectively a first connection surface and a second connection surface of the invention and respectively form a static-pressure air joint together with the first joint 6 and the second joint 6' to provide connection with the first rod 41 and the second rod 41'.

Figure 4:
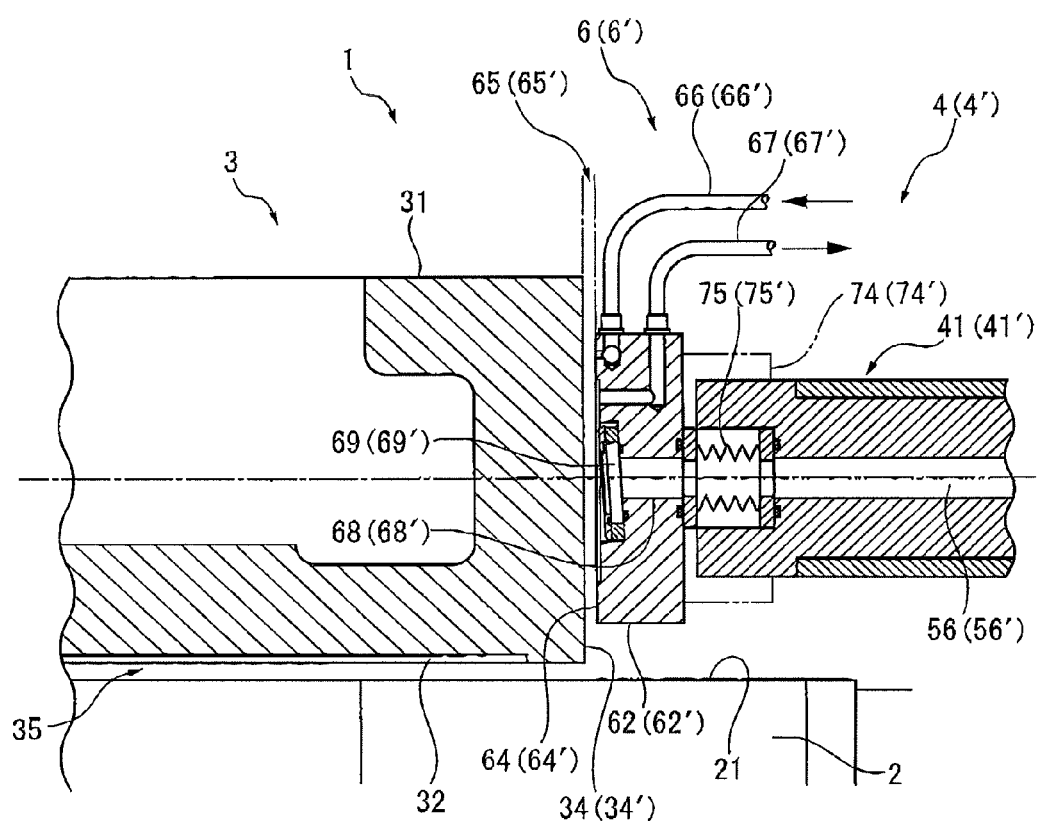
FIG. 4 is a vertical section showing a relevant part according to the first exemplary embodiment.

In FIG. 4, the first joint 6 includes a metallic joint member 62 shaped in a rectangular block, in which the joint member 62 is supported by and provided on the tip end of the first rod 41 to be opposed to the side 34 of the table 31. A surface of the joint member 62 opposite to the side 34 of the table 31 is defined as an opposed surface 64. The opposed surface 64 is polished so as to be a highly precise surface required for a static-pressure air joint. Likewise, the side 34 of the table 31 is also polished so as to be a highly precise surface required for a static-pressure air joint.

As shown in FIG. 1, the joint member 62 is supported by a support member 74 via a vertical turn shaft 72. The support member 74 is fixed on the tip end of the rod 41. With this arrangement, a gimbal mechanism is formed between the first joint 6 and the first rod 41, which allows the joint member 62 and the opposed surface 64 to be slidable in a yawing direction.

In FIG. 4, a static-pressure clearance 65 serving as a static-pressure air joint is formed between the opposed surface 64 of the joint member 62 and the side 34 of the table 31.

To the joint member 62, a fluid supply channel 66 and a fluid discharge channel 67 are connected, whereby fluid is supplied to and discharged from the static-pressure clearance 65.

The fluid supply channel 66 supplies a compressed air (fluid) to the static-pressure clearance 65 through fluid restrictors provided at plural positions near the circumference of the opposed surface 64.

The fluid discharge channel 67 connected with a negative pressure source discharges air from an area inside an area where the air is supplied near the circumference of the opposed surface 64.

With this arrangement, the pressurized air supplied near the circumference of the static-pressure clearance 65 from the fluid supply channel 66 is partially released toward the atmosphere from the circumference of the static-pressure clearance 65 while the air in the inside area is discharged from the fluid discharge channel 67.

Accordingly, in the inside area where the air is discharged, a tensile force to make the opposed surface 64 and the side 34 approach each other is generated and serves as preload for a static-pressure joint. In the air supply area near the circumference, a compression force is applied on an air film having a certain thickness, thereby providing a supplying-discharging static-pressure bearing.

A through hole 68 is formed at the center of the joint member 62.

A metallic bellows 75 is connected to the joint member 62 near the first rod 41, specifically, connected to the circumference of an opening of the first laser path 56 provided at the tip end of the first rod 41.

With this arrangement, the first laser path 56 inside the first rod 41, an inside of the bellows 75 and the through hole 68 intercommunicate with each other along the axis in the X-axis direction passing through the centroid C of the table 31.

A glass transparent plate 69 is provided in the through hole 68 near the opposed surface 64 and hermetically seals the inside of the through hole 68, the bellows 75 and the laser path 56 from the static-pressure clearance 65. The transparent plate 69 is transmissive of laser light from the first laser interferometer 5. The laser light arriving through the first laser path 56 is transmitted through the transparent plate 69 and is reflected by the side 34 of the table 31 to be again transmitted through the transparent plate 69 to return to the first laser path 56, where the laser light is detected by the first laser interferometer 5.

In this arrangement, since the side 34 of the table 31 is vertical and orthogonal to the X-axis direction and is kept orthogonal to an optical axis of the laser light passing through the first laser path 56, the side 34 can reliably reflect the laser light from the first laser path 56.

On the other hand, when the transparent plate 69 is fixed in the through hole 68, the transparent plate 69 is not orthogonal to the moving direction of the table 31 (i.e., the optical axis of the laser light passing through the first laser path 56), but the transparent plate 69 is fixed so as to be slightly angularly-inclined against the optical axis of the laser light. With this arrangement, any reflected components generated on the transparent plate 69 are deviated from the optical axis of the laser light and never return to the first laser interferometer 5.

The above description relates to the first joint 6 that connects the first rod 41 provided in the X-axis direction and the table 31. The same applies to the second joint 6' that connects the second rod 41' provided in the Y-axis direction and the table 31, in which overlapping descriptions will be omitted.

According to the exemplary embodiment, by driving the first and second rods 41 and 41' by the first and second drive mechanisms 4 and 4', the table 31 can be two-dimensionally moved in the X-axis direction and the Y-axis direction via the first and second joints 6 and 6'. A planar position of the moved table 31 is detectable by the first and second laser interferometers 5 and 5' (a displacement detector).

The first and second drive mechanisms 4 and 4' can exhibit a high precision inherent to a linear motor mechanism by respectively employing the linear motors 44 and 44'. In addition, since the linear motors 44 and 44' are disposed in a tube surrounding the first and second rods 41 and 41', a thrusting axis of the linear motors 44 and 44' can be aligned with the moving axis of the first and second rods 41 and 41'. With this arrangement, an offset error on the thrusting axis and the moving axis is eliminated, thereby enhancing a positioning accuracy of the table 31.

The first and second laser interferometers 5 and 5' exhibit a high precision with the use of laser interference. In addition, since the first and second laser interferometers 5 and 5' are respectively provided with the first and second laser paths 56 and 56' passing through the first and second rods 41 and 41', the first and second laser interferometers 5 and 5' can align moving axes of the first and second rods 41 and 41' and a position-detecting axis of the laser light with the moving direction of the table 31, thereby avoiding an offset error. Accordingly, the positioning accuracy for the table 31 can be enhanced.

Consequently, according to the exemplary embodiment, all the detecting axes of the first and second laser interferometers 5 and 5', the thrusting axes of the first and second drive mechanisms 4 and 4' and the moving axes of the first and second rods 41 and 41' can be respectively aligned with the axis in the X-axis direction and the axis in the Y-axis direction passing through the centroid C of the table 31, so that the precision transfer equipment 9 and 9' and two-dimension precision transfer equipment 1 capable of a highly precise movement based on a highly precise position-detection and a highly precise positioning can be provided.

In the exemplary embodiment, since the first and second joints 6 and 6' are provided by a supplying-discharging static-pressure joint, influences (e.g., vibration) generated by driving the first and second drive mechanisms 4 and 4' can be avoided and a highly precise movement can be conducted by driving only in the moving direction of the table 31.

Particularly, in the first and second joints 6 and 6', since the static-pressure clearances 65 and 65' are formed such that the opposed surfaces 64 and 64' of the joint members 62 and 62' are respectively opposed to the sides 34 and 34' of the table 31, in other words, since the sides 34 and 34' of the table 31 are directly used as a component of a static-pressure air joint, the mechanism can be simplified and displacements in directions orthogonal to each other are completely allowable. Thus, independency in the X-axis direction and the Y-axis direction can be secured in spite of the minimum needed elements of the mechanism.

For instance, when the first joint 6 in the X-axis direction is to be displaced in the Y-axis direction, the opposed surface 64 of the joint member 62 can be moved in the Y-axis direction while the static-pressure clearance 65 is kept at a predetermined interval to the side 34 of the table 31. Even under this situation, a driving force can be transmitted in the X-axis direction in the first joint 6.

Moreover, since the sides 34 and 34' of the table 31 are provided as reflection surfaces of the first and second laser paths 56 and 56', a mirror or the like to be separately provided can be omitted and displacements of the table 31 (the movable body) in the X-axis direction and the Y-axis direction can be directly detected, thereby achieving a further high precision.

The first and second laser paths 56 and 56' are particularly configured such that paths penetrating the first and second rods 41 and 41' are reduced in pressure, thereby achieving a high precision. In addition, since the first and second laser paths 56 and 56' penetrate the first and second joints 6 and 6' (the static-pressure air joints), displacements of the table 31 in directions orthogonal to each other are allowable without a mechanical connection to the table 31.

Further, since the opposed surfaces 64 and 64' are provided with the transparent plates 69 and 69' that hermetically seal the first and second laser paths 56 and 56' passing through from the inside of the first and second rods 41 and 41' to the through holes 68 and 68' from the static-pressure clearances 65 and 65', the pressures in the first and second laser paths 56 and 56' can be set at a reduced pressure irrespective of the air pressures of the static-pressure clearances 65 and 65'. Accordingly, even when the pressures of the static-pressure clearances 65 and 65' are high relative to the high vacuum required for the first and second laser paths 56 and 56', the fluid of the static-pressure clearances 65 and 65' can be kept from flowing into the first and second laser paths 56 and 56'.

Since the transparent plates 69 and 69' are inclined against the optical axes of the laser light passing through the first and second laser paths 56 and 56', any unnecessary reflection light is not returned to the first and second laser interferometers 5 and 5' in the measurement using the first and second laser interferometers 5 and 5'.

Second Exemplary Embodiment

Figure 5:
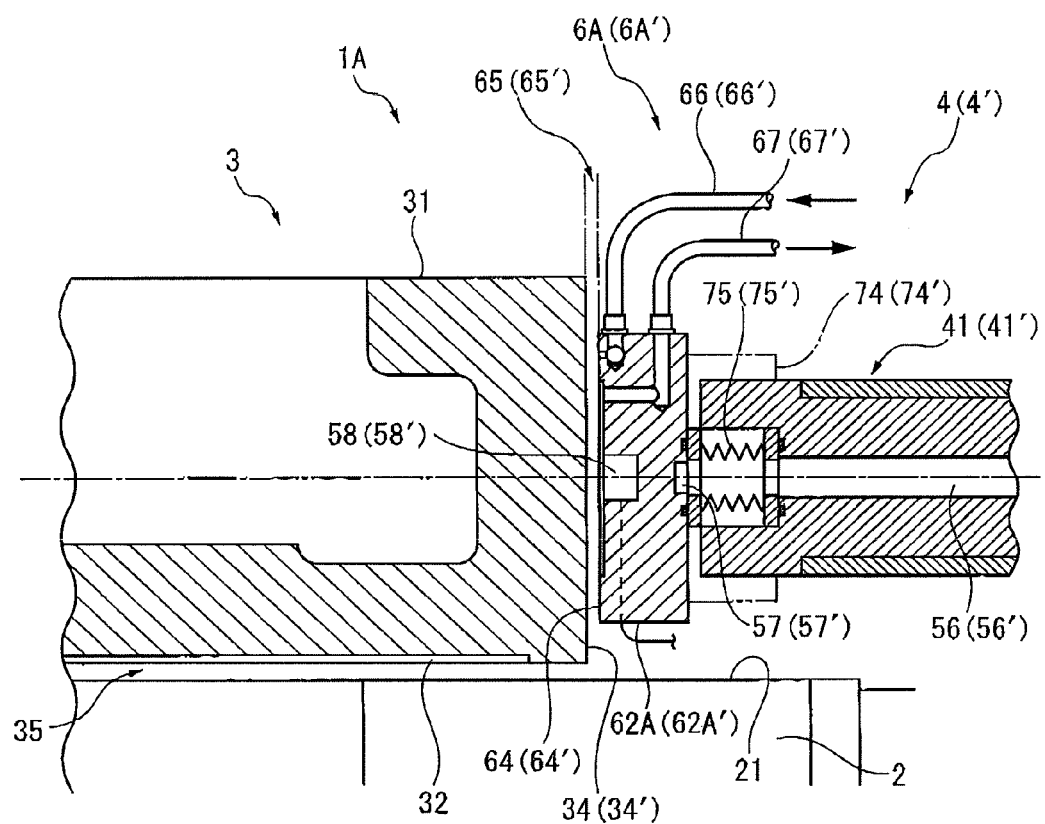
FIG. 5 is a vertical section showing a relevant part according to a second exemplary embodiment of the invention.

FIG. 5 shows a second exemplary embodiment of the invention.

Two-dimension precision transfer equipment 1A according to the second exemplary embodiment includes the same basic components as those in the two-dimension precision transfer equipment 1 according to the first exemplary embodiment. The same components are given with the same reference numerals in which overlapping description of the components will be omitted. A difference between the two-dimension precision transfer equipment 1A and 1 will be described below.

As shown in FIG. 5, in the second exemplary embodiment, joint members 62A and 62A' of first and second joints 6A and 6A' are not provided with the through holes 68 and 68' and the transparent plates 69 and 69' of the first exemplary embodiment (see FIG. 4).

Instead, the joint members 62A and 62A' are provided with mirrors 57 and 57' in an area surrounded by the bellows 57 and 57'.

The mirrors 57 and 57' are provided so as to be orthogonal to the optical axes of the first and second laser paths 56 and 56'. Laser light passing through the first and second laser paths 56 and 56' is reflected on the mirrors 57 and 57' and is returned to the first and second laser paths 56 and 56'.

In the second exemplary embodiment, since the laser light passing through the first and second laser paths 56 and 56' is reflected on the mirrors 57 and 57', the position of the table 31 cannot be directly detected by reflection of the laser light on the sides 34 and 34' of the table 31 unlike the first exemplary embodiment.

However, the mirrors 57 and 57' reflecting the laser light passing through the first and second laser paths 56 and 56' are provided in the joint members 62 and 62' and are kept at an equivalent interval to the table 31 via the static-pressure clearances 65 and 65', so that the first and second laser interferometers 5 and 5' can provide a sufficient detection accuracy.

Other advantages obtainable according to the second exemplary embodiment are the same as those according to the first exemplary embodiment.

In the second exemplary embodiment, the laser paths 56 and 56' extend only up to the joint members 62A and 62A'. Accordingly, the static-pressure clearances 65 and 65' are out of a target range for distance detection by the laser paths 56 and 56' unlike the above-described first exemplary embodiment.

Typically, since the joint 6 and 6' have a sufficient rigidity, fluctuation in a thickness of the static-pressure clearances 65 and 65' is ignorable. However, when acceleration in accelerating and decelerating the table 31 is large, load applied on the static-pressure clearances 65 and 65' becomes excessive to cause fluctuation in the thickness of the static-pressure clearances 65 and 65' to be unignorable.

In the exemplary embodiment, it is desirable to provide a displacement gauge that detects fluctuation in a thickness of the static-pressure clearances 65 and 65' or a distance detector that detects the thickness of the static-pressure clearances 65 and 65' in order to perform an adjustment calculation according to the fluctuation in the thickness of the static-pressure clearances 65 and 65'.

In FIG. 5, non-contact-type displacement gauges 58 and 58' are buried in the middle of surfaces (i.e., surfaces facing the static-pressure clearances 65 and 65') opposed to the sides 34 and 34' of the table 31 in the joint members 62 and 62A'. As such a non-contact-type displacement gauge 58, for instance, an electric-capacitance-type displacement gauge is applicable. Output signal lines of the displacement gauges 58 and 58' are drawn from the joint members 62A and 62A'. A controller of the two-dimension precision transfer equipment 1A performs adjustment calculation and the like with reference to the thickness of the static-pressure clearances 65 and 65' obtained from the displacement gauges 58 and 58'.

With the arrangement of the two-dimension precision transfer equipment 41A to cope with the fluctuation in the thickness of the static-pressure clearances 65 and 65', a position accuracy of the table 31 can be kept high even when an excessive acceleration is applied. In the case of no possibility of an excessive acceleration, the displacement gauges 58 and 58' may be omitted, thereby simplifying the arrangement.

Third Exemplary Embodiment

Figure 6:
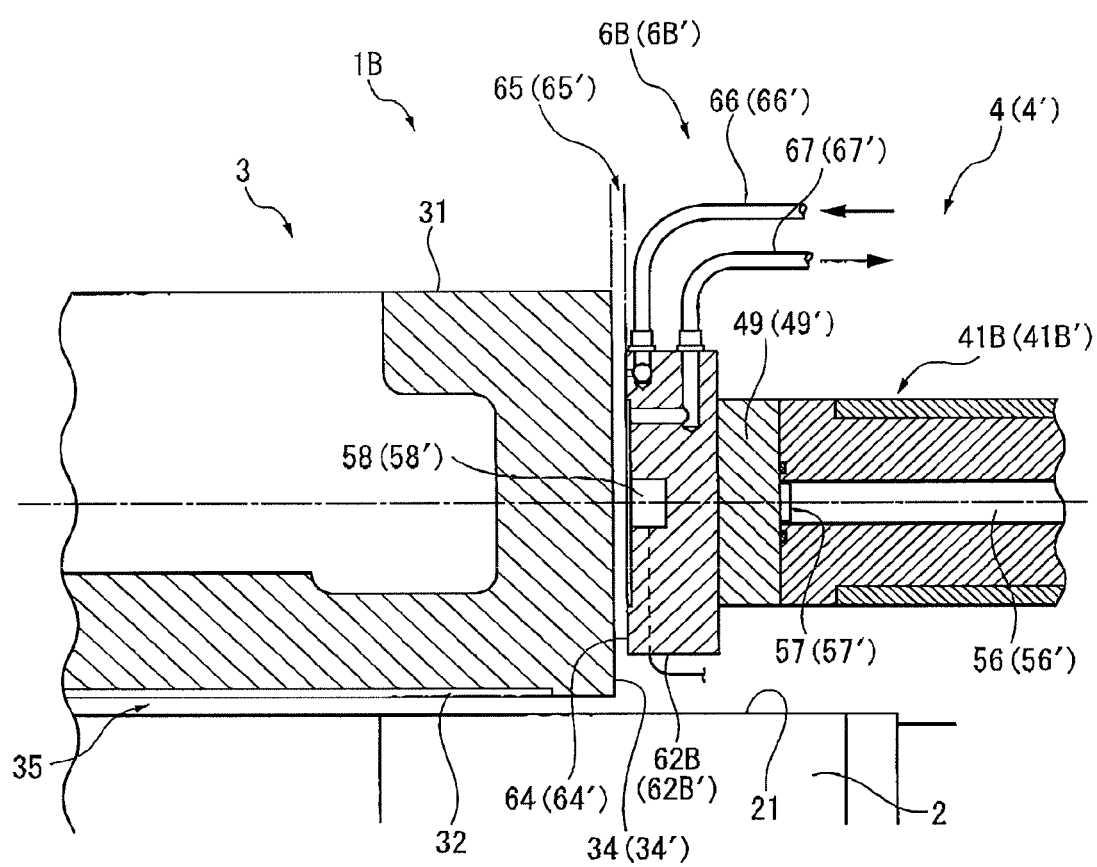
FIG. 6 is a vertical section showing a relevant part according to a third exemplary embodiment of the invention.

FIG. 6 shows a third exemplary embodiment of the invention.

Two-dimension precision transfer equipment 1B according to the third exemplary embodiment includes the same basic components as those in the two-dimension precision transfer equipment 1 according to the first exemplary embodiment. The same components are given with the same reference numerals in which overlapping description of the components will be omitted. A difference between the two-dimension precision transfer equipment 1B and 1 will be described below.

In FIG. 6, in the third exemplary embodiment, joint members 62B and 62B' of first and second joints 6B and 6B' are not provided with the through holes 68 and 68' and the transparent plates 69 and 69' of the first exemplary embodiment (see FIG. 4). Moreover, the turn shaft 72 and the support member 74 as described in the first exemplary embodiment are not provided in order to connect the joint members 62B and 62B' with first and second rods 41B and 41B'.

Instead, in the third exemplary embodiment, caps 49 and 49' are provided at tip ends of the first and second rods 41B and 41B' and are directly fixed to the joint members 62B and 62B'.

In the third exemplary embodiment, the caps 49 and 49' seal tip ends of the first and second laser paths 56 and 56' and the mirrors 57 and 57' are provided on an inside of the caps 49 and 49' to face the first and second laser paths 56 and 56'.

The mirrors 57 and 57' are provided so as to be orthogonal to the optical axes of the first and second laser paths 56 and 56'. Laser light passing through the first and second laser paths 56 and 56' is reflected on the mirrors 57 and 57' and is returned to the first and second laser paths 56 and 56'.

In the third exemplary embodiment, since the laser light passing through the first and second laser paths 56 and 56' is reflected on the mirrors 57 and 57', the position of the table 31 cannot be directly detected by reflection of the laser light on the sides 34 and 34' of the table 31 unlike the first exemplary embodiment.

However, the mirrors 57 and 57' reflecting the laser light passing through the first and second laser paths 56 and 56' are provided on the inside the caps 49 and 49' fixed to the joint members 62B and 62B' and are kept at an equivalent interval to the table 31 via the static-pressure clearances 65 and 65', so that the first and second laser interferometers 5 and 5' can provide a sufficient detection accuracy.

Other advantages obtainable according to the third exemplary embodiment are the same as those according to the first exemplary embodiment.

Also in the third exemplary embodiment, fluctuation in a thickness of air films of the static-pressure clearances 65 and 65' of the first and second joints 6B and 6B' is not detected by the laser paths 56 and 56'. Accordingly, it is desirable to add the displacement gauges 58 and 58' as described in the second exemplary embodiment and detect the fluctuation in the thickness of the static-pressure clearances 65 and 65' in conjunction with an excessive acceleration to perform adjustment and the like as needed.

Fourth Exemplary Embodiment

Figure 7:
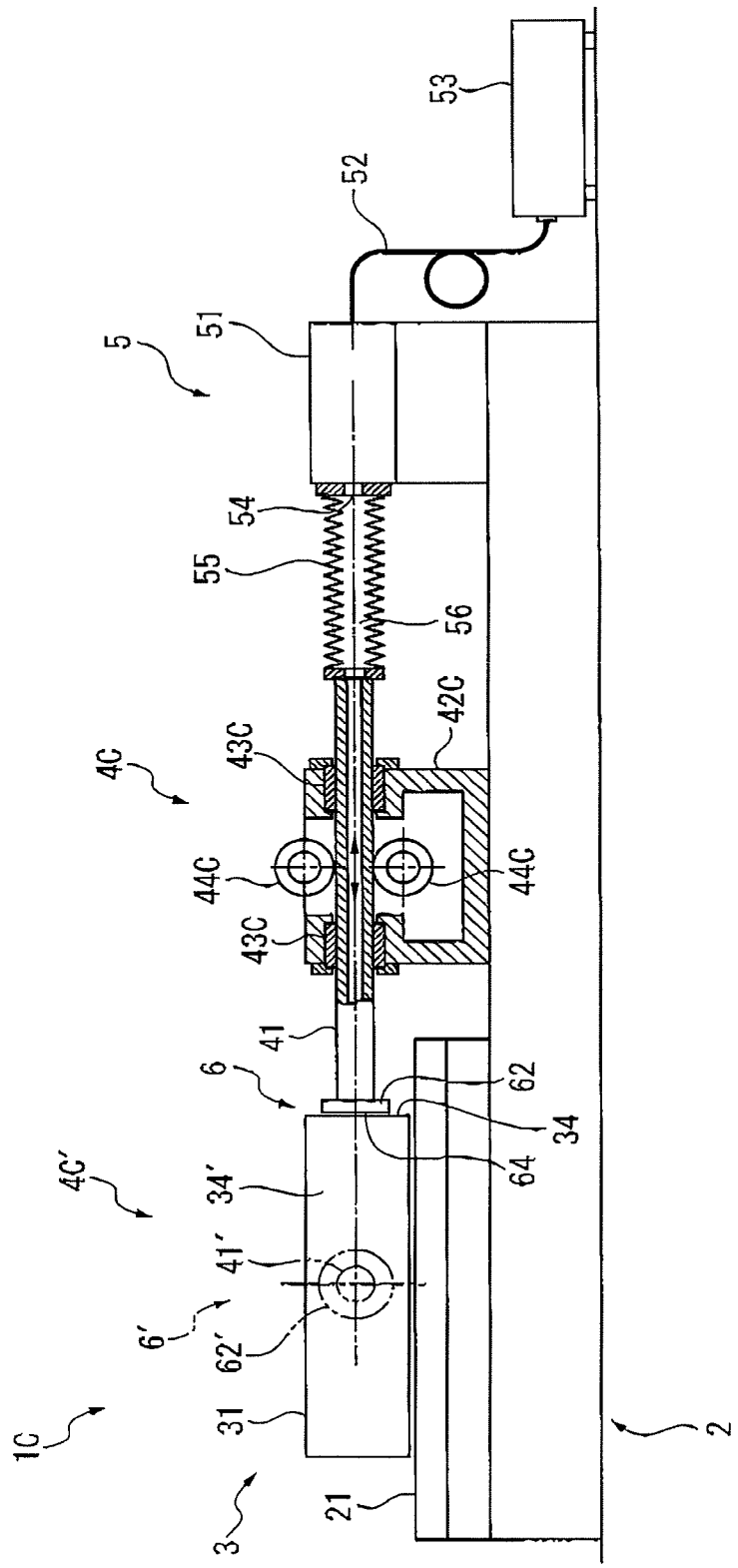
FIG. 7 is a vertical section showing a part according to a fourth exemplary embodiment of the invention.

FIG. 7 shows a fourth exemplary embodiment of the invention.

Two-dimension precision transfer equipment 1C according to the forth exemplary embodiment includes the same basic components as those in the two-dimension precision transfer equipment 1 according to the first exemplary embodiment. The same components are given with the same reference numerals in which overlapping description of the components will be omitted. A difference between the two-dimension precision transfer equipment 1C and 1 will be described below.

A difference between the fourth exemplary embodiment and the first exemplary embodiment is that the driving source of the first and second drive mechanisms 4 and 4' is not a linear motor but a pair of friction-rolling-type drive rollers that are opposed to each other.

In FIG. 7, the first drive mechanism 4C includes a casing 42C, rod guide 43C and drive rollers 44C in order to drive the first rod 41.

In first drive mechanism 4C, a pair of drive rollers 44C are opposed to each other with the first rod 41 interposed therebetween, so that the pair of drive rollers 44C are symmetrical to the first rod 41. To the drive rollers 44C, a rotation force from a power source (e.g., an electric motor) (not shown) is transmitted via a transmission mechanism, whereby the pair of drive rollers 44C are rotated at an equal speed to apply a symmetrical driving forces on the first rod 41.

In the same manner as in the first drive mechanism 4C in the X-axis direction, a second drive mechanism 4C' is provided in the Y-axis direction.

In the fourth exemplary embodiment, a driving force cannot be transmitted in a non-contact manner, unlike the linear motors 44 and 44' of the first and second drive mechanisms 4 and 4' according to the first exemplary embodiment. However, by synchronously rotating the pair of drive rollers 44C opposed to each other with the first and second rods 41 and 41' interposed therebetween, the driving forces symmetrical to the first and second rods 41 and 41' are applied and the moving axes of the first and second rods 41 and 41' and the thrusting axes of the first and second drive mechanisms 4C and 4C' are aligned with each other and are also aligned with the detecting axes of the laser interferometers 5 and 5', so that a high precision without offset is obtainable.

Further, in the fourth exemplary embodiment, since the first and second drive mechanisms 4C and 4C' are configured to include the pair of drive rollers 44C, the configuration of the fourth exemplary embodiment can be extremely simplified as compared with the first and second drive mechanisms 4 and 4' using the linear motors 44 and 44' according to the first exemplary embodiment, thereby significantly reducing equipment cost. A sufficient precision is also achievable by aligning the axes of equipment selectable according to usage.

Fifth Exemplary Embodiment

Figure 8:
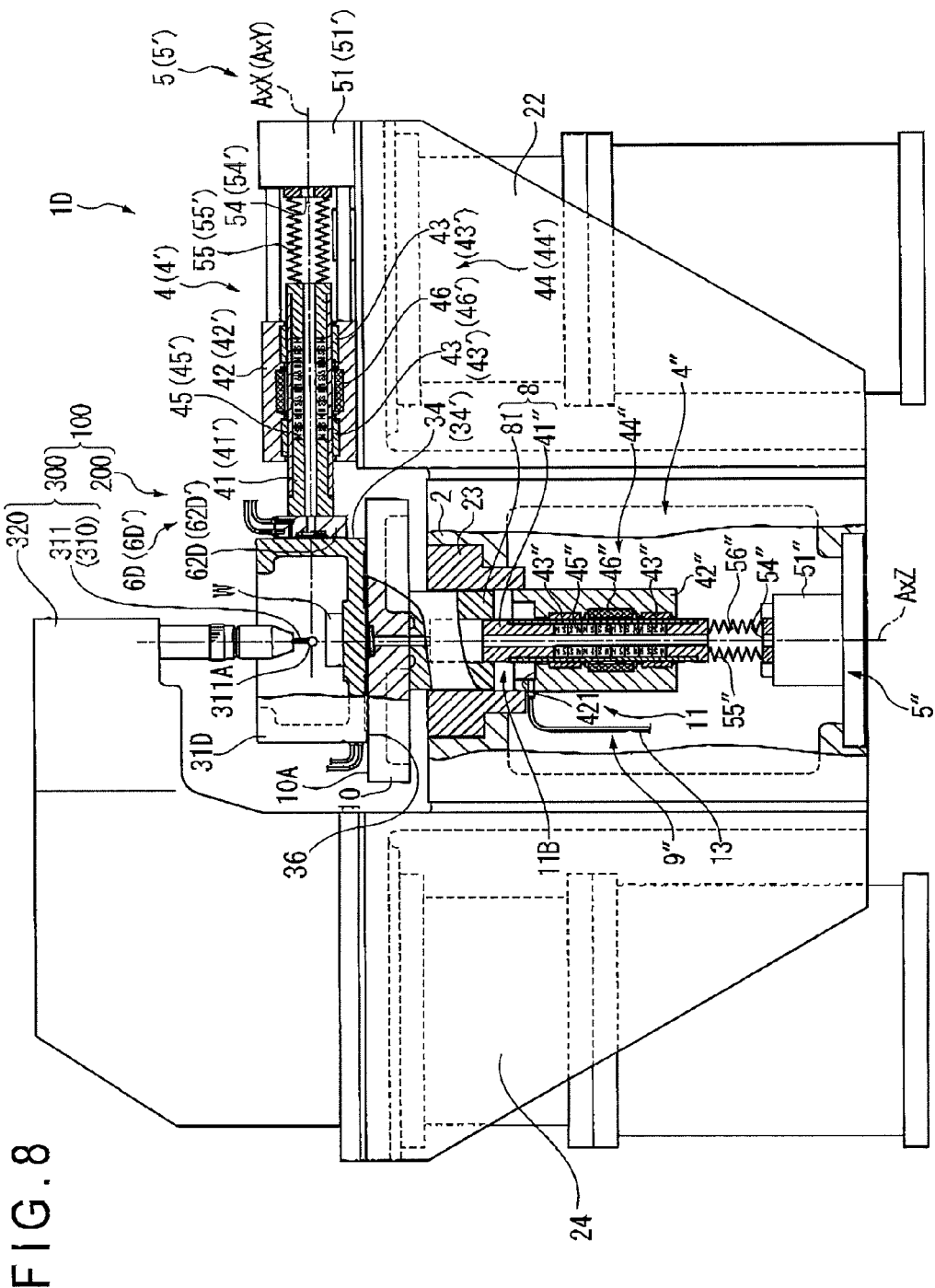
FIG. 8 is a vertical section showing an overall structure of coordinate measuring machine according to a fifth exemplary embodiment of the invention.

FIG. 8 is a vertical section showing an overall structure of a coordinate measuring machine 100 according to a fifth exemplary embodiment of the invention.

The coordinate measuring machine 100 according to the fifth exemplary embodiment is a contact-type coordinate measuring machine that measures dimensions and a shape of an object W by contacting a stylus tip 311A on a surface of the object W.

The coordinate measuring machine 100 includes a three-dimension precision transfer equipment 200, measuring equipment 300 including a contact-type probe 310, and a controller (not shown).

Figure 9:
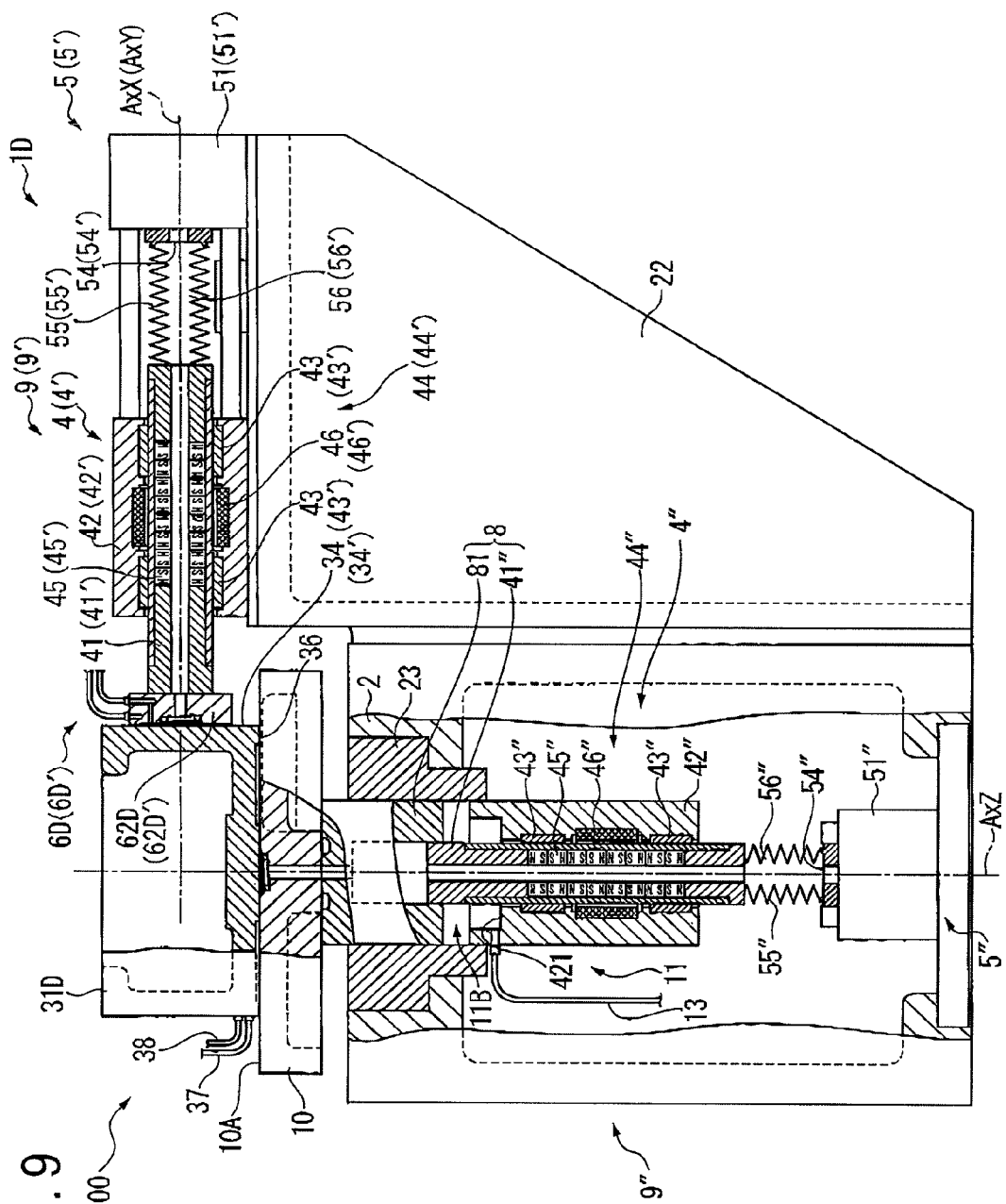
FIG. 9 is a vertical section showing three-dimension precision transfer equipment according to the fifth exemplary embodiment.

FIG. 9 shows a vertical section of the three-dimension precision transfer equipment 200 according to the fifth exemplary embodiment. Specifically, FIG. 9 is an enlarged view showing a part of FIG. 8.

The three-dimension precision transfer equipment 200 moves a table 31D (i.e., the object W) in the X-axis direction (i.e., a first direction: a horizontal direction in FIG. 9), the Y-axis direction (i.e., a second direction: a direction orthogonal to the paper in FIG. 9), and the Z-axis direction (i.e., a vertical direction in FIG. 9).

As shown in FIG. 9, the three-dimension precision transfer equipment 200 includes a two-dimension precision transfer equipment 1D and a third precision feeding device 9" that moves the table 31D in the Z-axis direction for positioning.

The third precision feeding device 9" and the components thereof are denoted by adding a double prime (") to the reference numerals representing the first precision feeding device 9 and the components thereof and overlapping descriptions may be omitted as needed.

Figure 10:
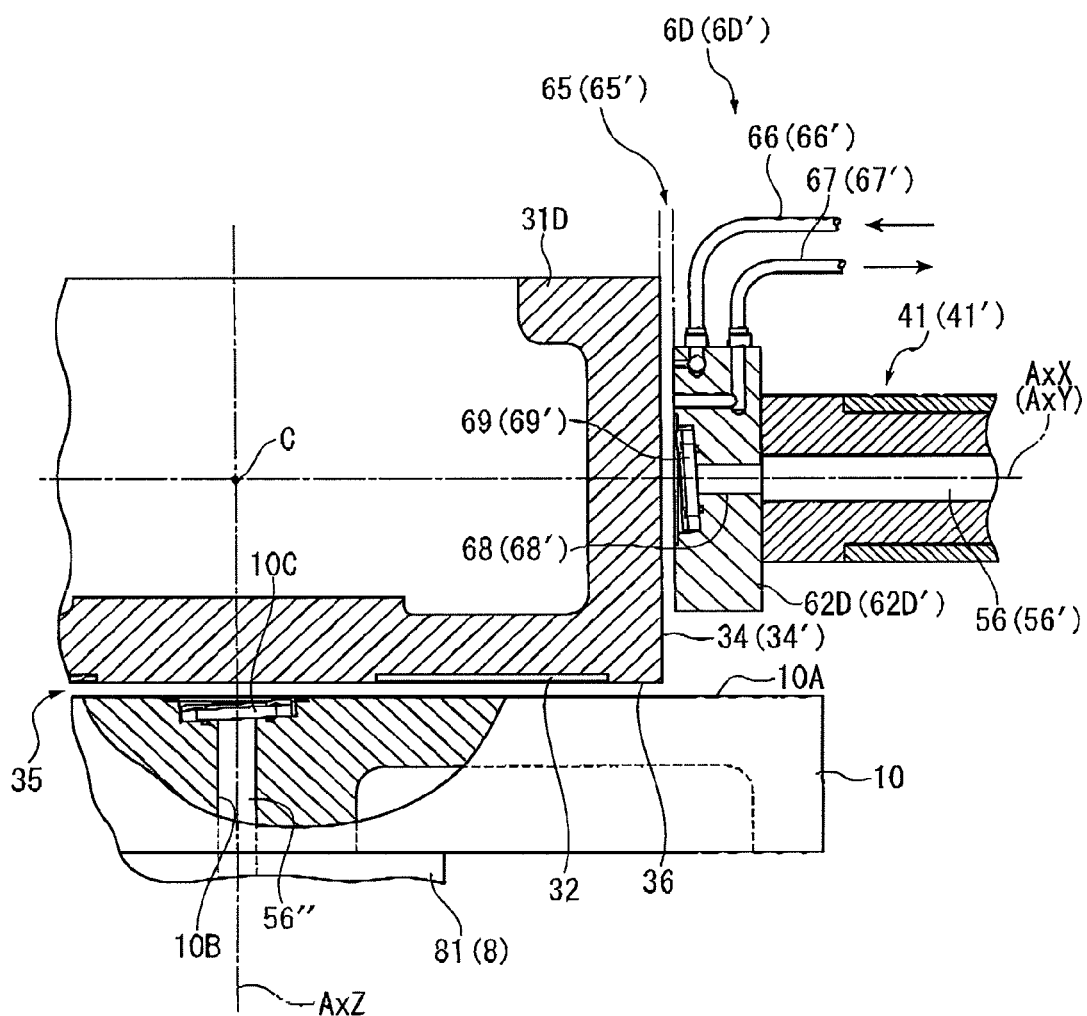
FIG. 10 is an enlarged vertical section showing a part of the three-dimension precision transfer equipment according to the fifth exemplary embodiment.

FIG. 10 is an enlarged vertical section showing a part of the three-dimension precision transfer equipment 200. Specifically, FIG. 10 is an enlarged view showing a part of FIG. 9.

Two-dimension precision transfer equipment 1D according to the fifth exemplary embodiment includes the same basic components as those in the two-dimension precision transfer equipment 1 according to the first exemplary embodiment. The same components are given with the same reference numerals in which overlapping description of the components will be omitted. A difference between the two-dimension precision transfer equipment 1D and 1 will be described below.

In the two-dimension precision transfer equipment 1D according to the fifth exemplary embodiment, as shown in FIG. 10, joint members 62D and 62D' of first and second joints 6D and 6D' are directly connected to the first and second rods 41 and 41' without the turn shaft 72, the support member 74 and the bellows 75 as described above in the first exemplary embodiment (see FIG. 4).

Figure 11:
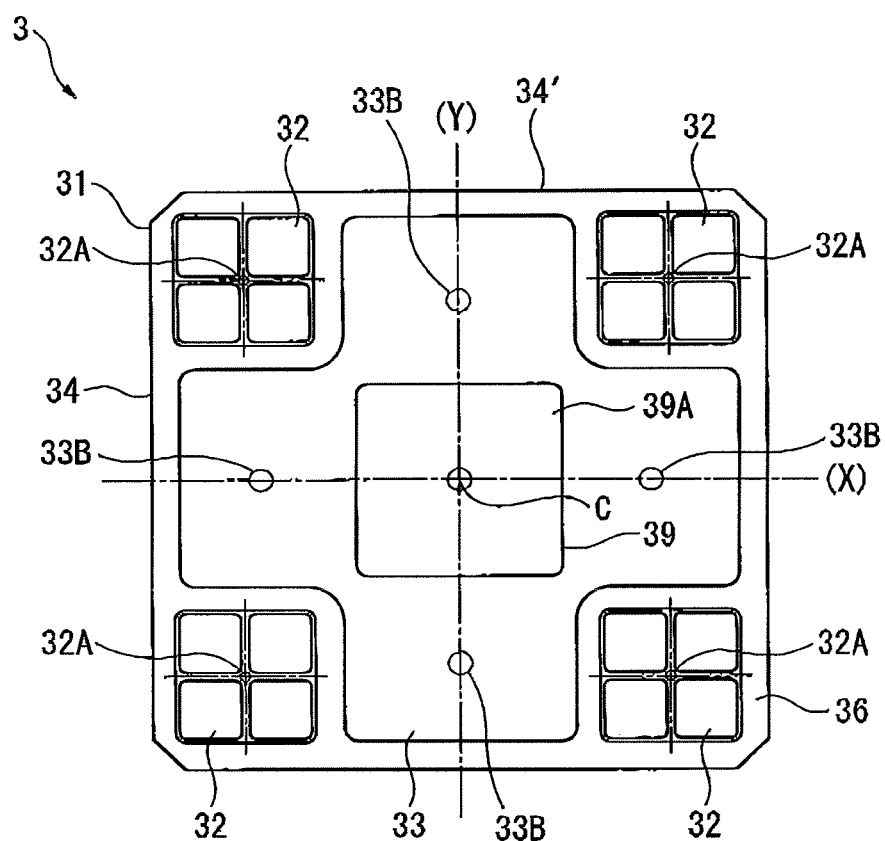
FIG. 11 is a bottom view showing a table according to the fifth exemplary embodiment.

FIG. 11 is a bottom view showing the table 31D.

In the two-dimension precision transfer equipment 1D, the table 31D is different from the table 31 of the first exemplary embodiment in the following points.

In the fifth exemplary embodiment, the table 31D is supported in non-contact with an upper surface (an opposed surface) 10A of a two-dimension guide plate 10 forming the third precision feeding device 9" and is movable as needed in the X-axis direction and Y-axis direction.

The static-pressure clearance 35 serving as a static-pressure air joint is formed between the upper surface 10A of the two-dimension guide plate 10 and a bottom surface 36 of the table 35.

The bottom surface 36 of the table 31D is formed as a third connection surface of the invention in a flat surface having a sufficiently high flatness and smoothness and being orthogonal to the Z-axis direction so as to form a static-pressure air joint.

Moreover, similar to the table 31 according to the first exemplary embodiment, the static-pressure air bearing 32 (including the fluid restrictor 32A) and the negative pressure portion 33 (including the discharge hole 33A) are formed on the bottom surface 36 as shown in FIG. 11.

Further, as shown in FIG. 9, the fluid supply channel 37 and the fluid discharge channel 38 are connected to the table 31, whereby pressurized fluid is supplied to and discharged from the static-pressure clearance 35.

The fluid supply channel 37 communicates with lattice-shaped grooves formed on the four corners of the bottom surface 36 and supplies pressurized air (fluid) to the static-pressure clearance 35 through the fluid restrictor 32A and the grooves.

The air in the negative pressure portion 33 connected with the fluid discharge channel 38 is discharged through the discharge hole 33A.

With this arrangement, the pressurized air supplied in the static-pressure clearance 35 from the fluid supply channel 37 is partially released toward the atmosphere from the circumference of the static-pressure clearance 35 while the air in the inside area is discharged through the discharge hole 33A from the fluid discharge channel 38.

Accordingly, the inside area where the air is discharged becomes a negative pressure area, which causes a tensile force to make the upper surface 10A of the two-dimension guide plate 10 and the bottom surface 36 of the table 31D approach each other. The tensile force serves as preload for a static-pressure joint. In the air supply area near the circumference, a compression force is applied on an air film having a certain thickness, thereby providing the static-pressure clearance 35.

In other words, a supplying-discharging static-pressure joint is formed by the two-dimension guide plate 10 and the table 31D.

As shown in FIG. 11, a reflection portion 39 shaped in a square plateau is formed in the middle of the cross in the negative pressure portion 33.

A lower surface 39A of the reflection portion 39 is formed in a flat surface having a sufficiently high flatness and smoothness and being orthogonal to the Z-axis direction and is used as a reflection surface of a later-described third laser path 56".

As shown in FIG. 9, the third precision feeding device 9" includes a third drive mechanism 4", a third laser interferometer 5" (a third displacement detector), a third driving body 8 and the two-dimension guide plate 10 (a third joint).

The third drive mechanism 4" drives the third driving body 8.

In this arrangement, a casing 42", rod guides 43", a linear motor 44", a magnet 45" and an induction coil 46" (i.e., the components of the third drive mechanism 4") are the same as those of the first drive mechanism 4 except for being disposed at different positions and in different directions.

The third laser interferometer 5" detects a displacement of the table 31D in the Z-axis direction.

In this arrangement, an interferometer body 51", a laser beam window 54", a bellows 55" and a second laser path 56" (i.e., the components of the third laser interferometer 5") are the same as those of the first laser interferometer 5 except for being disposed at different positions and in different directions.

Although not shown in FIGS. 8 to 10, the interferometer body 51" is connected with the external laser source 53 (see FIG. 1) through an optical fiber (not shown).

Consequently, the laser source 53 (a single laser source) is shared by the first to third laser interferometers 5, 5' and 5" with the optical fiber branched halfway.

The third driving body 8 is driven by the third drive mechanism 4" to move forward and backward in the Z-axis direction.

The third driving body 8 includes a piston portion 81 and a third rod 41" as shown in FIG. 9.

The third rod 41" is disposed along the Z-axis direction and is driven by the third drive mechanism 4" to move forward and backward in the Z-axis direction.

Figure 12:
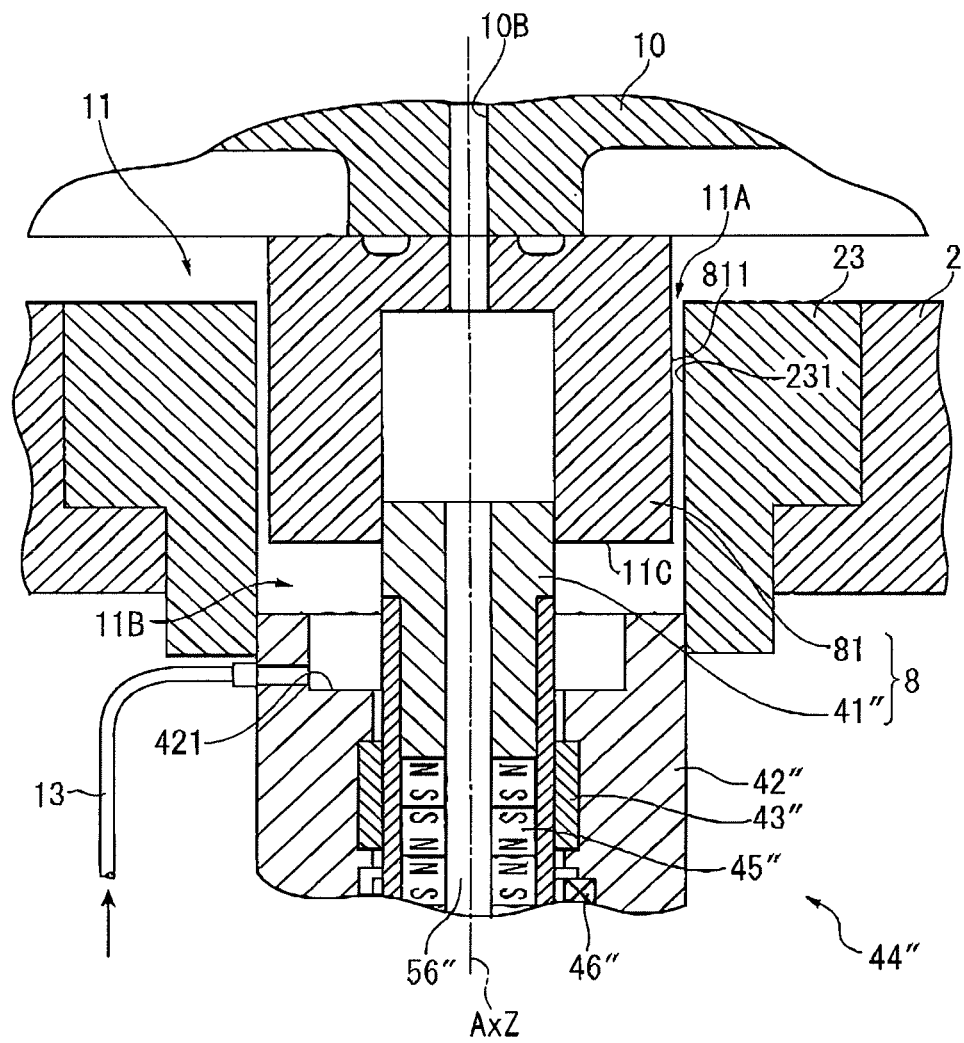
FIG. 12 is an enlarged vertical section showing a part of the three-dimension precision transfer equipment according to the fifth exemplary embodiment.

FIG. 12 is an enlarged vertical section showing a part of the three-dimension precision transfer equipment 200. Specifically, FIG. 12 is an enlarged view showing a part of FIG. 9.

The piston portion 81 has a cylindrical shape. A tip end (an upper end) of the third rod 41" is fitted and fixed to a lower part of the piston portion 81 such that an axis of the cylinder of the piston portion 81 is aligned coaxially with an axis of the third rod 41".

The piston portion 81 is inserted through a cylinder portion 23 to which the casing 42" is fixed.

The cylinder portion 23 is shaped substantially in a cylindrical faun having an inner diameter slightly larger than an outer diameter of the piston portion 81 and is fixed to the base 2 such that an axis of the cylinder is aligned coaxially with the Z-axis direction, as shown in FIG. 12.

In FIG. 12, a static-pressure clearance 11A serving as a cylindrical static-pressure air bearing is formed between an outer circumferential surface 811 of the piston portion 81 and an inner circumferential surface 231 of the cylinder portion 23.

The static-pressure clearance 11A is formed by pressurized air being supplied between the inner circumferential surface 231 of the cylinder portion 23 and the outer circumferential surface 811 of the piston portion 81 through several fluid restrictors included in the cylinder portion 23 from an external pressurized fluid supply source (not specifically shown).

The piston portion 81 is supported in non-contact with the cylinder portion 23 by the static-pressure clearance 11A and is movable in the Z-axis direction together with the third rod 41" while being guided by the cylinder portion 23.

In other words, the piston portion 81, the third rod 41", the cylinder portion 23 and the casing 42" described above provide a piston cylinder mechanism 11 in which the third driving body 8 is movable in the Z-axis direction.

Inside the piston cylinder mechanism 11, a pressurized chamber 11B to which fluid (high pressure air) is supplied from an external fluid supply source (not shown) and that receives a load from the third driving body 8.

As shown in FIG. 12, the pressurized chamber 11B is a space provided between the piston portion 81 and the casing 42" and is surrounded by a lower surface of the piston portion 81, an outer circumferential surface of the third rod 41", an upper surface of the casing 42" and the inner circumferential surface 231 of the cylinder portion 23.

As shown in FIG. 12, a circular concave portion 421 that surrounds the third rod 41" is formed on the upper surface of the casing 42".

The high pressure air from the external fluid supply source (not shown) is supplied to an inside (the pressurized chamber 11B) of the concave portion 421 through the fluid supply channel 13 that communicates with the concave portion 421.

In this exemplary embodiment, a pressure of the air supplied to the pressurized chamber 11B is set at a pressure calculated by dividing a total weight of the table 31D, the third driving body 8 and the two-dimension guide plate 10 by an area of a pressure receiving surface 11C of the third driving body 8.

Herein, the pressure receiving surface 11C refers to a surface that faces the pressurized chamber 11B of the third driving body 8, extends in a direction orthogonal to the Z-axis direction, and receives a push-up force of the air in the pressurized chamber 11B against the piston portion 81, as shown in FIG. 12.

In short, the pressure receiving surface 11C in this exemplary embodiment corresponds to the lower surface of the piston portion 81.

The two-dimension guide plate 10 is a rectangular plate having the upper surface 10A formed in a tint surface orthogonal to the Z-axis direction. The two-dimension guide plate 10 and the table 31 provide a supplying-discharging static-pressure joint.

The two-dimension guide plate 10 is fixed to an upper surface of the piston portion 81 projecting beyond the cylinder portion 23 and is movable in the Z-axis direction together with the piston portion 81 and the third rod 41".

As shown in FIG. 10, a through hole 10B is formed in the middle of the two-dimension guide plate 10.

The third laser path 56" inside the third rod 41", an inside of the piston portion 81 and the through hole 10B intercommunicate with each other along the axis in the Z-axis direction passing through the centroid C of the table 31D.

As shown in FIG. 10, a transparent plate 10C similar to the transparent plate 69 of the first precision feeding device 9 is provided in the through hole 10B near the upper surface 10A and hermetically seals the through hole 10B, the inside of the piston portion 81 and the inside of the laser path 56" from the static-pressure clearance 35.

As shown in FIG. 8, the measuring equipment 300 includes the contact-type probe 310 and a support mechanism 320.

The contact-type probe 310 includes a stylus 311 having a spherical stylus tip 311A at a tip end.

As shown in FIG. 8, the support mechanism 320 is provided on a support base 24 that laterally projects from the side of the base 2, and supports a base of the stylus 311.

The support mechanism 320 biases the stylus 311 in each of the X-axis direction, the Y-axis direction and the Z-axis direction, thereby supporting the stylus 311 to be positioned at a predetermined position. When an external force is applied on the stylus tip 311A (i.e., when the stylus tip 311A is in contact with the object W), the support mechanism 320 can move the stylus 311 in each of the X-axis direction, the Y-axis direction and the Z-axis direction within a predetermined range.

The support mechanism 320 includes a probe sensor (not specifically shown) for each of the X-axis, the Y-axis and the Z-axis for detecting a position of the stylus 311 in each of the X-axis direction, the Y-axis direction and the Z-axis direction. The probe sensor is a position sensor that outputs signal according to displacement of the stylus 311 in each of the X-axis direction, the Y-axis direction and the Z-axis direction.

Figure 13:
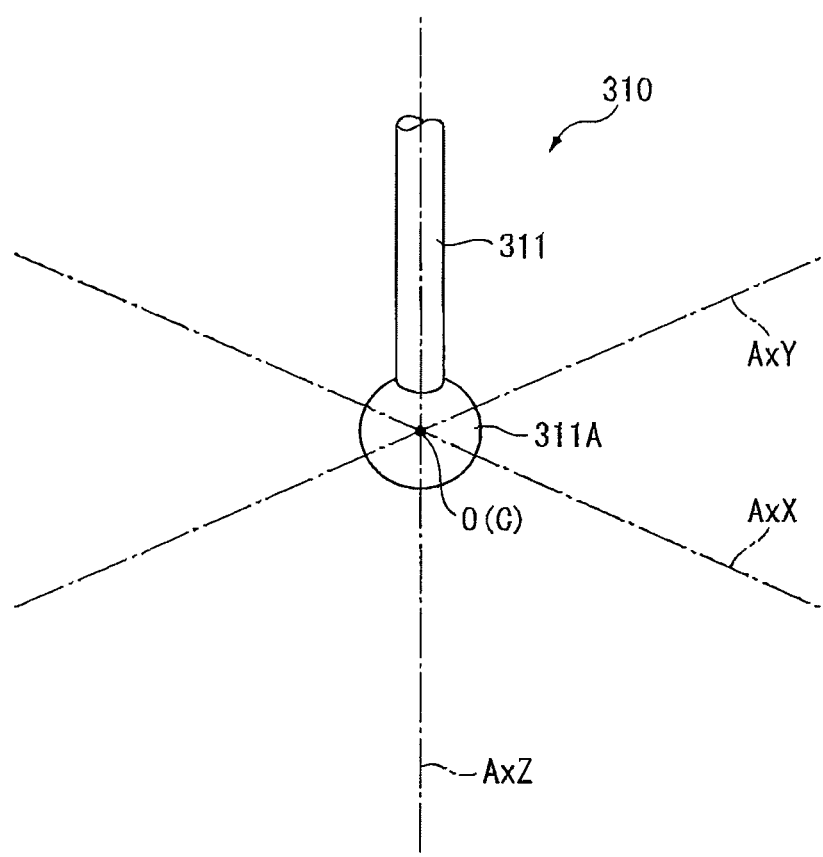
FIG. 13 is a perspective view showing where a contact-type probe according to the fifth exemplary embodiment is provided.

FIG. 13 is a perspective view showing where the contact-type probe 310 is provided.

In this exemplary embodiment, the support mechanism 320 supports the contact-type probe 310 as described below under no external force applied on the stylus tip 311A.

Specifically, as shown in FIG. 13, the support mechanism 320 supports the contact-type probe 310 such that a central position O of the stylus tip 311A coincides with an intersection (i.e., the centroid position C of the table 31D) of imaginary lines AxX, AxY and AxZ respectively provided by imaginarily extending the first to third laser paths 56, 56' and 56".

The centroid position C of the table 31D is set to be a central position of each stroke of the first to third precision feeding devices 9, 9' and 9".

The controller measures dimensions and a shape of the object W based on the above-described signal according to displacement from each of the probe sensors and the position of the table 31D in each of the X-axis direction, the Y-axis direction and the Z-axis direction which is detected by the first to third laser interferometers 5, 5' and 5".

Specifically, the controller recognizes whether the stylus tip 311A is in contact with the object W based on the above-described signal according to displacement from each of the probe sensors while moving the table 31D in each of the X-axis direction, the Y-axis direction and the Z-axis direction by operating the first to third precision feeding devices 9, 9' and 9".

When the controller recognizes that the stylus tip 311A is in contact with the object W, the controller measures dimensions and a shape of the object W with reference to a displacement of the table 31D in each of the X-axis direction, the Y-axis direction and the Z-axis direction which is detected by the first to third laser interferometers 5, 5' and 5".

Since the three-dimension precision transfer equipment 200 according to this exemplary embodiment includes the two-dimension precision transfer equipment 1D substantially the same as the two-dimension precision transfer equipment 1 according to the first exemplary embodiment, the three-dimension precision transfer equipment 200 can provide the same features and advantages as those of the first exemplary embodiment.

The three-dimension precision transfer equipment 200 includes the third drive mechanism 4" and the third driving body 8 in addition to the two-dimension precision transfer equipment 1D. The two-dimension guide plate 10 provided in the third driving body 8 provides a static-pressure joint for forming the static-pressure clearance 35 between the two-dimension guide plate 10 and the bottom surface 36 of the table 31 in the same manner as the first and second joints 6D and 6D'.

In other words, between the upper surface 10A of the two-dimension guide plate 10 and the bottom surface 36 of the table 31D, a drive force in the Z-axis direction by the third drive mechanism 4" is transmitted and displacements in the X-axis direction and the Y-axis direction by the first and second drive mechanisms 4 and 4' are allowable.

Accordingly, when the first to third drive mechanisms 4, 4' and 4" drive the first to third rods 41, 41' and 41", the table 31D can be moved in each of the X-axis direction, the Y-axis direction and the Z-axis direction.

When a static-pressure joint is used for each of connection between the first and second rods 41 and 41' and the table 31D and connection between the third driving body 8 and the table 31D, a driving force can be transmitted in non-contact through the static-pressure clearances 65, 65' and 35. Accordingly, while avoiding influences (e.g., vibration) generated by driving the first to third drive mechanisms 4, 4' and 4", the table 31D can be moved in three dimensions.

Similar to the first and second precision feeding devices 9 and 9', the third precision feeding device 9" employs the linear motor 44" as the third drive mechanism 4" and the third laser interferometer 5" having the third laser path 56" penetrating the third driving body 8 as the third displacement detector.

Accordingly, the moving axes of the first to third rods 41, 41' and 41" can be aligned with the thrusting axes of the first to third drive mechanisms 4, 4' and 4". By aligning the moving axes and the thrusting axes with the detecting axes of the laser interferometers 5, 5' and 5", high precision without offset is obtainable.

Since the piston cylinder mechanism 11 is provided between the third driving body 8 and the base 2, when the third driving body 8 is driven by the third drive mechanism 4", the piston portion 81 (i.e., the third driving body 8) (table 31D) is movable in the Z-axis direction while being supported by the cylinder portion 23.

Particularly, since the static-pressure clearance 11A is formed between the outer circumferential surface 811 of the piston portion 81 and the inner circumferential surface 231 of the cylinder portion 23, the piston portion 81 is smoothly movable in the Z-axis direction.

Moreover, since the pressurized chamber 11B is provided inside the piston cylinder mechanism 11, the weight of the third driving body 8 is receivable by the air inside the pressurized chamber 11B.

In other words, since the driving force for driving to move the third driving body 8 forward and backward is reducible, a load of the linear motor 44" is reducible and heat generation thereof is also suppressible.

The inner pressure of the pressurized chamber 11B is set at a pressure calculated by dividing the total weight of the table 31D, the third driving body 8 and the two-dimension guide plate 10 by the area of the pressure receiving surface 11C.

Accordingly, the push-up force of the air in the pressurized chamber 11B against the third driving body 8 can be balanced with a push-down force of the table 31D, the third driving body 8 and the two-dimension guide plate 10 against the third driving body 8, the push-down force corresponding to the weight of the table 31D, the third driving body 8 and the two-dimension guide plate 10.

Consequently, the driving force for driving to move the third driving body 8 forward and backward is significantly reducible.

The coordinate measuring machine 100 includes the three-dimension precision transfer equipment 200 and the measuring equipment 300 as described above.

With this arrangement, the table 31D (the object W) is moved in three dimensions by the three-dimension precision transfer equipment 200 while the contact-type probe 310 is fixed at a predetermined position relative to the base 2. With reference to displacements (coordinate values) of the table 31D in the X-axis direction, the Y-axis direction and the Z-axis direction which are detected by the first to third laser interferometers 5, 5' and 5" when the stylus tip 311A is in contact with the object W, dimensions and a shape of the object W can be measured.

The contact-type probe 310 is supported by the base 2 such that the central position O of the stylus tip 311A coincides with the intersection (i.e., the centroid position C of the table 31D) of the imaginary lines AxX, AxY and AxZ.

Accordingly, a displacement of the table 31D (the object W) in each of the X-axis direction, the Y-axis direction and the Z-axis direction can be measured in a manner to satisfy the Abbe's principle.

Consequently, dimensions and a shape of the object W can be measured with a high precision.

Modification(s)

The invention is not limited to the exemplary embodiments as described above, but may include any modification or improvement as long as an object of the invention can be achieved.

For instance, in the first to third drive mechanisms 4, 4' and 4", the arrangement of the linear motors 44, 44' and 44" is not limited to the cylindrical linear motor formed by using the ring magnets 45, 45' and 45" and the ring induction coils 46, 46' and 46". Alternatively, the linear motors 44, 44' and 44" each may be provided by a linear motor having a tubular profile as a whole by arranging a plurality of linear motors, in each of which a magnet 45 (45', 45") and an induction coil 46 (46', 46") are disposed along the moving axis, around the circumference of the first rod 41 (the second rod 41', the third rod 41").

The first and second drive mechanisms 4C and 4C' includes a pair of drive rollers 44C, but may include two or more pairs of drive rollers 44C. For instance, in addition to the pair of drive rollers 44C vertically disposed, a pair of drive rollers 44C may be horizontally juxtaposed. Such plural pairs of drive rollers 44C can also support the first rod 41, so that one of the rod guides 43 can be omitted.

Further, not only friction rolling by the drive rollers 44C but also other mechanisms such as a feed screw shaft may be used. For example, a feed screw shaft may be juxtaposed on both sides of each of the first to third rods 41, 41' and 41" in which a thrusting axis is aligned with a moving axis.

The bellows 55, 55' and 55" between the first to third drive mechanisms 4, 4' and 4" and the first to third laser interferometers 5, 5' and 5" may be replaced by a telescopic structure and the like.

In the above exemplary embodiments, the shape of the tables 31 and 31D is not limited to a substantial square, but may be changed as needed. For example, as long as two sides 34 and 34' form a right angle, other sides are not necessarily along the X axis or the Y axis. The shape of the tables 31 and 31D in a plan view may be a right-angled triangle or a sector having a central angle of 90 degrees. Alternatively, when partial sides 34 and 34' forming a right angle are provided at two positions of a table having an outer circumference in a free curve, the invention is applicable.

In the first to fourth exemplary embodiments, for supporting the table 31 relative to the base 2, not only the static-pressure air bearing but also other non-contact support structures may be used. For example, a magnetic levitation mechanism may be used. Further, support for the table 31 is not limited to the non-contact support. The table 31 may be supported in a mariner movable in two dimensions on the base 2 by a rolling support with a ball bearing. The same applies to the support for the table 31D relative to the two-dimension guide plate 10 in the fifth exemplary embodiment.

In the fifth exemplary embodiment, the two-dimension precision transfer equipment 1A to 1C according to the second to fourth exemplary embodiments may be used in place of the two-dimension precision transfer equipment 1D.

In the fifth exemplary embodiment, the arrangement of the third laser path 56' is not limited to the arrangement in which the bottom surface 36 of the table 31D (the lower surface 39A of the reflecting portion 39) is provided as a reflection surface, but may be the arrangement in which the mirror 57 or the like is separately provided as a reflection surface as in the second or third exemplary embodiment.

In the fifth exemplary embodiment, the coordinate measuring machine 100 employs the contact-type probe 310. However, the arrangement of the coordinate measuring machine 100 is not limited thereto but may include an optical non-contact probe that does not abut on the object W.

When the coordinate measuring machine 100 includes an optical non-contact probe as described above, it is preferable that the optical non-contact probe is supported by the support mechanism 320 such that a detecting point of the optical non-contact probe coincides with an intersection of the imaginary lines AxX, AxY and AxZ.

In the fifth exemplary embodiment, both the fluid supply channel 37 and the fluid discharge channel 38 are provided to the table 31D. However, the arrangement of the fluid supply channel 37 and the fluid discharge channel 38 is not limited to this, but may be an arrangement in which the fluid supply channel 37 is provided to the table 31D and the fluid discharge channel 38 is provided to the two-dimension guide plate 10.

In the first exemplary embodiment, both the fluid supply channel 66 and the fluid discharge channel 67 are provided to the first and second joints 6 and 6'. However, the arrangement of the fluid supply channel 66 and the fluid discharge channel 67 is not limited thereto, but may be an arrangement in which the fluid supply channel 66 is provided to the first and second joints 6 and 6' and the fluid discharge channel 67 is provided to the table 31. The same applies to the second to fourth exemplary embodiments.

What is claimed is:

1. A two-dimension precision transfer equipment comprising:
   a base;
   a movable body that is supported by the base and is movable in mutually orthogonal first and second directions;
   a hollow tubular first driving body extending in the first direction and a hollow tubular second driving body extending in the second direction, both of which are connected to the movable body;
   a first drive mechanism that drives to move the first driving body forward and backward in the first direction;
   a second drive mechanism that drives to move the second driving body forward and backward in the second direction;
   a first displacement detector that detects a displacement in the first direction of the movable body relative to the base; and
   a second displacement detector that detects a displacement in the second direction of the movable body relative to the base, wherein:
   the movable body has a first connection surface extending in the second direction and a second connection surface extending in the first direction,
   the first driving body has a first joint forming a static-pressure clearance between the first driving body and the first connection surface,
   the second driving body has a second joint forming a static-pressure clearance between the second driving body and the second connection surface,
   the first displacement detector is a first laser interferometer having a first laser path that penetrates an interior of the first driving body and extends in the first direction aligned with a moving axis of the first driving body and a thrusting axis of the first drive mechanism, and
   the second displacement detector is a second laser interferometer having a second laser path that penetrates an interior of the second driving body and extends in the second direction aligned with a moving axis of the second driving body and a thrusting axis of the second drive mechanism.

2. The two-dimension precision transfer equipment according to claim 1, wherein the first joint and the second joint each are a supplying-discharging static-pressure joint comprising: the first connection surface or the second connection surface of the movable body; an opposed surface that is connected to the first driving body or the second driving body and is opposed to the first connection surface or the second connection surface; a fluid supply channel that guides pressurized fluid into the static-pressure clearance formed between the first connection surface or the second connection surface and the opposed surface; and a fluid discharge channel that is connected with a negative pressure source and discharges the fluid from the static-pressure clearance.

3. The two-dimension precision transfer equipment according to claim 1, wherein
the first laser path penetrates the first driving body and the first joint to extend in the first direction and is provided with the first connection surface as a reflection surface, and
the second laser path penetrates the second driving body and the second joint to extend in the second direction and is provided with the second connection surface as a reflection surface.

4. The two-dimension precision transfer equipment according to claim 1, wherein each of the opposed surfaces of the first joint and the second joint is provided with a transparent plate that hermetically seals the first laser path or the second laser path penetrating the first driving body or the second driving body from the static-pressure clearance and is inclined against an optical axis of the first laser path or the second laser path.

5. A three-dimension precision transfer equipment comprising:
the two-dimension precision transfer equipment according to claim 1;
a third driving body that is supported by the base and on which the movable body is mounted;
a third drive mechanism that drives to move the third driving body forward and backward in a vertical direction; and
a third displacement detector that detects a displacement in the vertical direction of the movable body relative to the base, wherein
the first direction and the second direction are orthogonal to the vertical direction,
the movable body has a third connection surface orthogonal to the vertical direction,
the third driving body has a third joint forming a static-pressure clearance between the third joint and the third connection surface, and
the third displacement detector is a third laser interferometer having a third laser path that penetrates the third driving body and extends in the vertical direction.

6. The three-dimension precision transfer equipment according to claim 5, wherein the third joint is a supplying-discharging static-pressure joint comprising: the third connection surface of the movable body; an opposed surface that is connected to the third driving body and is opposed to the third connection surface; a fluid supply channel that supplies fluid into the static-pressure clearance formed between the third connection surface and the opposed surface; and a fluid discharge channel that is connected with a negative pressure source and discharges the fluid from the static-pressure clearance.

7. The three-dimension precision transfer equipment according to claim 5, wherein the third laser path penetrates the third driving body and the third joint to extend in the vertical direction and is provided with the third connection surface as a reflection surface.

8. The three-dimension precision transfer equipment according to claim 5, wherein the opposed surface of the third joint is provided with a transparent plate that hermetically seals the third laser path penetrating the third driving body from the static-pressure clearance and is inclined against an optical axis of the third laser path.

9. The three-dimension precision transfer equipment according to claim 5, further comprising:
a piston cylinder mechanism comprising: a piston portion provided in the third driving body; and a cylinder portion that is fixed to the base and supports the piston portion to be movable in the vertical direction, wherein
the piston cylinder mechanism comprises a pressurized chamber to which pressurized fluid is supplied from an outside and receives a load of the third driving body.

10. The three-dimension precision transfer equipment according to claim 9, wherein
the piston cylinder mechanism comprises a pressure receiving surface that faces the pressurized chamber and receives a push-up force against the piston portion from the fluid in the pressurized chamber, and
an inner pressure of the pressurized chamber is set at a pressure calculated by dividing a total weight of the movable body, the third driving body, the piston portion and the third joint by an area of the pressure receiving surface.

11. A coordinate measuring machine comprising:
the three-dimension precision transfer equipment according to claim 5, and
a measuring equipment that is supported by the base and measures an object to be mounted on the movable body.

12. The coordinate measuring machine according to claim 11, wherein
the measuring equipment comprises a probe having a spherical stylus tip to be brought into contact with the object,
imaginary lines respectively provided by imaginarily extending the first laser path, the second laser path and the third laser path intersect at a single intersection,
and the measuring equipment is supported by the base such that a central position of the stylus tip coincides with the intersection of the imaginary lines.

* * * * *